US011488640B2

(12) United States Patent
Ryu et al.

(10) Patent No.: US 11,488,640 B2
(45) Date of Patent: Nov. 1, 2022

(54) METHOD OF RESETTING STORAGE DEVICE, STORAGE DEVICE PERFORMING THE SAME AND DATA CENTER INCLUDING THE SAME

(71) Applicant: Samsung Electronics Co., Ltd., Suwon-si (KR)

(72) Inventors: Chunghyun Ryu, Hwaseong-si (KR); Minsung Kil, Hwaseong-si (KR); Youngsang Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/346,212

(22) Filed: Jun. 12, 2021

(65) Prior Publication Data

US 2022/0101889 A1    Mar. 31, 2022

(30) Foreign Application Priority Data

Sep. 29, 2020  (KR) .......................... 10-2020-0126539

(51) Int. Cl.
*G11C 5/14* (2006.01)
(52) U.S. Cl.
CPC .................... *G11C 5/148* (2013.01)
(58) Field of Classification Search
CPC ......... G11C 5/148; G11C 16/30; G11C 5/147; G06F 1/24; G06F 3/0658
See application file for complete search history.

(56) References Cited

U.S. PATENT DOCUMENTS

| 7,123,062 | B2 | 10/2006 | Do |
| 7,516,347 | B2* | 4/2009 | Kim ...................... G06F 1/3203 713/320 |
| 7,948,815 | B2 | 5/2011 | Song |
| 9,355,025 | B2 | 5/2016 | Shim et al. |
| 9,990,023 | B2 | 6/2018 | Paley et al. |
| 2011/0126046 | A1* | 5/2011 | Hoang ................ G06F 11/2015 713/340 |
| 2013/0179629 | A1* | 7/2013 | Shim ..................... G06F 11/073 711/103 |
| 2013/0254464 | A1 | 9/2013 | Kimura et al. |
| 2020/0365224 | A1* | 11/2020 | Sudo ....................... G11C 29/14 |

FOREIGN PATENT DOCUMENTS

| EP | 0910089 A2 | 4/1999 |
| KR | 100656469 B1 | 12/2006 |
| KR | 100901972 B1 | 6/2009 |
| KR | 101402493 B1 | 6/2014 |

* cited by examiner

*Primary Examiner* — Khamdan N. Alrobaie
(74) *Attorney, Agent, or Firm* — Muir Patent Law, PLLC

(57) ABSTRACT

In a method of resetting a storage device, an internal power supply voltage is generated based on an external power supply voltage. A first reset control signal that is activated when a level of the internal power supply voltage is higher than a reference level. A second reset control signal that is activated after a power-on of the storage device is completed or deactivated after a predetermined delay time from when the external power supply voltage is turned off. A final reset control signal is generated based on the first reset control signal and the second reset control signal. The final reset control signal is activated when at least one of the first and second reset control signals is activated. After the external power supply voltage is turned off, a reset operation is performed when the final reset control signal is activated.

19 Claims, 16 Drawing Sheets

|  | INPUT | | OUTPUT |
|---|---|---|---|
|  | DRST | FORDY | FRST |
| CASE11 | 0 | 0 | 0 |
| CASE12 | 0 | 1 | 1 |
| CASE13 | 1 | 0 | 1 |
| CASE14 | 1 | 1 | 1 |

FIG. 19

|  | INPUT | | OUTPUT |
| --- | --- | --- | --- |
|  | DRST | PODDLY | FRST |
| CASE21 | 0 | 0 | 0 |
| CASE22 | 0 | 1 | 1 |
| CASE23 | 1 | 0 | 1 |
| CASE24 | 1 | 1 | 1 |

METHOD OF RESETTING STORAGE DEVICE, STORAGE DEVICE PERFORMING THE SAME AND DATA CENTER INCLUDING THE SAME

CROSS-REFERENCE TO RELATED APPLICATION

This application claims priority under 35 USC § 119 to Korean Patent Application No. 10-2020-0126539, filed on Sep. 29, 2020 in the Korean Intellectual Property Office (KIPO), the contents of which are herein incorporated by reference in their entirety.

BACKGROUND

1. Technical Field

Example embodiments relate generally to semiconductor integrated circuits, and more particularly to methods of resetting storage devices, storage devices performing the methods, and data centers including the storage devices.

2. Description of the Related Art

Certain types of data storage devices include one or more semiconductor memory devices. Examples of such data storage devices include solid state drives (SSDs). These types of data storage devices may have various design and/or performance advantages over hard disk drives (HDDs). Examples of potential advantages include the absence of moving mechanical parts, higher data access speeds, stability, durability, and/or low power consumption. Recently, various systems, e.g., a laptop computer, a car, an airplane, a drone, etc., have adopted the SSDs for data storage.

The storage device includes a storage controller and a nonvolatile memory. When a specific event occurs, such as when power applied to the storage device is suddenly turned off, it is necessary to reset the storage controller. If the reset operation is not normally completed, an operation error may occur in the storage controller and the storage device.

SUMMARY

Example embodiments of the present disclosure provide a method of resetting a storage device capable of efficiently protecting the storage device by preventing an abnormal reset off in which a reset operation is unintentionally stopped.

Example embodiments of the present disclosure provide a storage device that performs the method of resetting the storage device.

Example embodiments of the present disclosure provide a data center that includes the storage device.

According to example embodiments, in a method of resetting a storage device, an external power supply voltage is received at the storage device. An internal power supply voltage is generated based on the external power supply voltage. A first reset control signal that is activated when a level of the internal power supply voltage is higher than a reference level and or deactivated when the level of the internal power supply voltage is lower than or equal to the reference level. A second reset control signal that is activated after a power-on of the storage device is completed and or deactivated after a predetermined delay time from when the external power supply voltage is turned off. A final reset control signal is generated based on the first reset control signal and the second reset control signal. The final reset control signal is activated when at least one of the first and second reset control signals is activated. After the external power supply voltage is turned off, a reset operation of the storage device during is performed when the final reset control signal is activated.

According to example embodiments, a storage device includes a power-loss protection integrated circuit (PLP IC), a reset detector, a reset controller and a storage controller. The power-loss protection integrated circuit generates an internal power supply voltage based on an external power supply voltage. The reset detector generates a first reset control signal that is activated or deactivated based on a level of the internal power supply voltage. The reset controller generates a final reset control signal based on the first reset control signal and a second reset control signal that is activated or deactivated with a timing different from that of the first reset control signal. The final reset control signal is activated or deactivated with a timing different from those of the first reset control signal and the second reset control signal. The storage controller controls an operation of the storage device, and performs a reset operation based on the final reset control signal when the external power supply voltage is turned off.

According to example embodiments, in a method of resetting a storage device, an external power supply voltage is received at the storage device. An internal power supply voltage is generated based on the external power supply voltage. The internal power supply voltage has a level lower than or equal to a level of the external power supply voltage. A driving voltage is generated based on one of the external power supply voltage and the internal power supply voltage. A first reset control signal is generated by detecting the level of the internal power supply voltage such that the first reset control signal is activated when the level of the internal power supply voltage is higher than a reference level or deactivated when the level of the internal power supply voltage is lower than or equal to the reference level. A second reset control signal that is activated when a power-on or a booting operation of the storage device is completed or deactivated after a predetermined delay time from when the external power supply voltage is turned off. A final reset control signal is generated based on the first reset control signal and the second reset control signal. The final reset control signal is activated when at least one of the first reset control signal and the second reset control signal is activated and deactivated when the first and second reset control signals are deactivated. A power off detection signal is generated by detecting the level of the external power supply voltage when the external power supply voltage is turned on or turned off. When the external power supply voltage is turned off, a reset operation is performed based on the final reset control signal and the driving voltage. The second reset control signal is a signal that is generated based on an off ready signal provided from a storage controller included in a storage device or based on the power off detection signal. The final reset control signal maintains an activation level for a predetermined time after the external power supply voltage is turned off. The reset operation is performed based on the final reset control signal having the activation level and the driving voltage generated based on the internal power supply voltage.

According to example embodiments, a data center includes an application server and a storage server. The application server receives a data write request or a data read request. The storage server includes a storage device that stores write data corresponding to the data write request, and outputs read data corresponding to the data read request. The storage device includes a power-loss protection integrated circuit (PLP IC), a reset detector, a reset controller and a storage controller. The power-loss protection integrated circuit generates an internal power supply voltage based on an external power supply voltage. The reset detector generates a first reset control signal that is activated or deactivated based on a level of the internal power supply voltage. The reset controller generates a final reset control signal based on the first reset control signal and a second reset control signal that is activated or deactivated with a timing different from that of the first reset control signal. The final reset control signal is activated or deactivated with a timing different from those of the first reset control signal and the second reset control signal. The storage controller controls an operation of the storage device, and performs a reset operation based on the final reset control signal when the external power supply voltage is turned off.

In the method of resetting the storage device, the storage device and the data center according to example embodiments, the reset operation may be controlled based on not only the first reset control signal generated based on the internal power supply voltage but also the second reset control signal having a timing different from that of the first reset control signal. For example, the reset operation may be performed based on the final reset control signal generated based on the first and second reset control signals. Accordingly, the abnormal reset off in which the reset operation is unintentionally stopped may be prevented, and the storage device may be efficiently protected. In other words, in the storage device supporting the power-loss protection operation, the unintentional reset off and the failure of a PLP dump operation may be prevented, the storage device may be protected from entering an error mode due to the blackout, and thus the storage device may have the improved or enhanced reliability.

BRIEF DESCRIPTION OF THE DRAWINGS

Illustrative, non-limiting example embodiments will be more clearly understood from the following detailed description taken in conjunction with the accompanying drawings.

FIGS. 18 and 19 are diagrams for describing an operation of a storage device of FIG. 16 according to example embodiments.

DETAILED DESCRIPTION OF THE EMBODIMENTS

Figure 1:
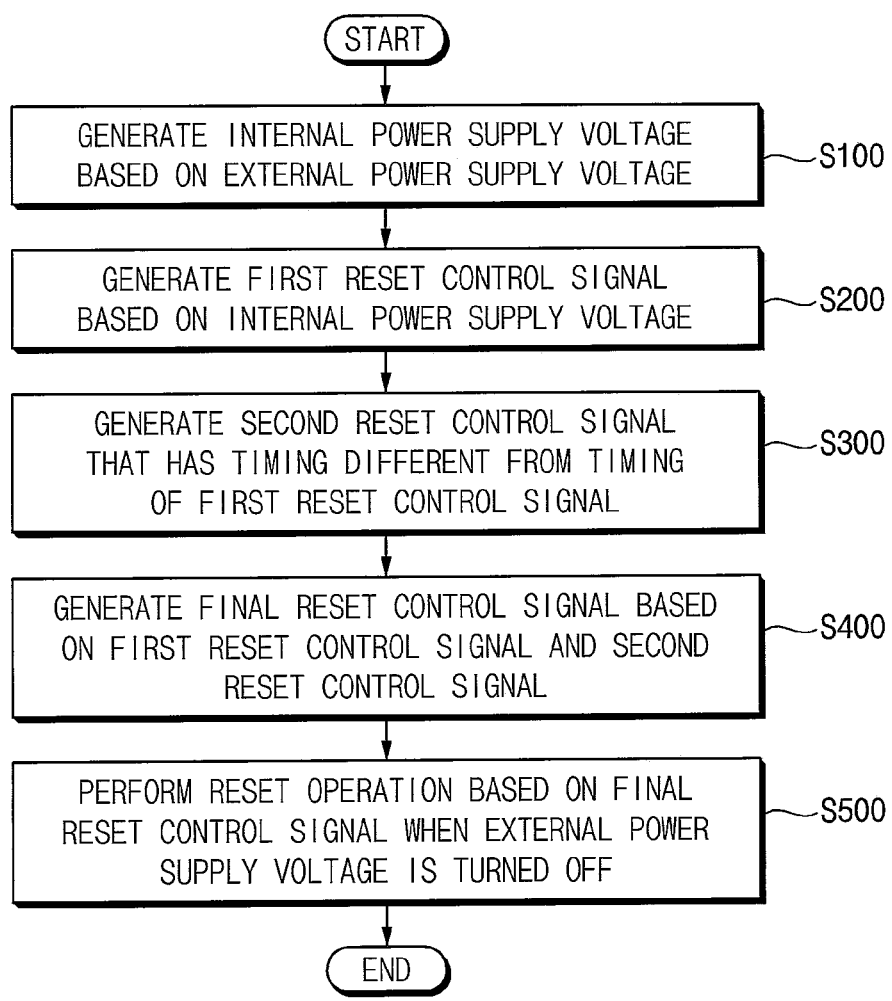
FIG. 1 is a flowchart illustrating a method of resetting a storage device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart illustrating a method of resetting a storage device according to example embodiments.

Referring to FIG. 1, a storage device that performs or executes a method of resetting the storage device according to example embodiments includes a plurality of nonvolatile memories and a storage controller. The plurality of nonvolatile memories store data, and the storage controller controls an operation of the plurality of nonvolatile memories. The storage device further includes a power-loss protection integrated circuit (PLP IC), a power management integrated circuit (PMIC) and a reset signal generator. The power-loss protection integrated circuit performs a power-loss protection operation, the power management integrated circuit generates at least one driving voltage, and the reset signal generator generates a reset control signal for controlling a reset operation. Detailed configurations of the storage device and a storage system including the storage device will be described with reference to FIG. 2.

In the method of resetting the storage device according to example embodiments, an internal power supply voltage is generated based on an external power supply voltage (step S100). The external power supply voltage may be used to generate the driving voltage during a normal operation of the storage device, and the internal power supply voltage may be used to generate the driving voltage when the external power supply voltage is turned off (e.g., when the storage device is powered off). The external power supply voltage may decrease to a ground voltage when the external power supply voltage is turned off.

A first reset control signal is generated based on the internal power supply voltage (step S200). For example, the first reset control signal may be generated such that the first reset control signal is activated or deactivated based on a level of the internal power supply voltage. Detailed operations of step S200 and detailed configurations for performing step S200 will be described with reference to FIGS. 5, 9 and 11.

A second reset control signal is generated (step S300). The second reset control signal has a timing different from that of the first reset control signal. For example, the second reset control signal may be activated or deactivated with a timing different from that of the first reset control signal.

In some example embodiments, the second reset control signal may be an off ready signal that is provided from the storage controller. In other example embodiments, the second reset control signal may be generated based on a power off detection signal that is provided from the power-loss protection integrated circuit. However, the invention is not limited thereto, and the second reset control signal may be any signal having a timing different from that of the first reset control signal. For example, the second reset control signal may be provided from the reset signal generator. Detailed operations of step S300 and detailed configurations for performing step S300 will be described with reference to FIGS. 6, 9, 15, 16 and 17.

A final reset control signal is generated based on the first reset control signal and the second reset control signal (step S400). The final reset control signal has a timing different from those of the first reset control signal and the second reset control signal. For example, the final reset control signal may be activated or deactivated with a timing different from those of the first reset control signal and the second reset control signal. Detailed operations of step S400 and detailed configurations for performing step S400 will be described with reference to FIGS. 7, 9 and 12.

When the external power supply voltage is turned off, a reset operation is performed based on the final reset control signal (step S500). For example, the reset operation may be performed based on a control of the storage controller. Detailed operations of step S500 will be described with reference to FIG. 8.

The power-loss protection operation in the storage device represents that the storage device is driven based on the internal power supply voltage for a certain time interval even when the external power supply voltage is blocked. Particularly, the power-loss protection operation represents that the reset operation is performed on the storage device based on the internal power supply voltage such that the operation of the storage device is normally terminated before the internal power supply voltage is turned off. When the internal power supply voltage instantaneously or momentarily falls below a reference level due to the power switching and/or the increase in leakage current, an abnormal reset off in which the reset operation is unintentionally stopped may occur, and an operation error may occur on the storage device.

In the method of resetting the storage device according to example embodiments, the reset operation may be controlled based on not only the first reset control signal generated based on the internal power supply voltage but also the second reset control signal having a timing different from that of the first reset control signal. For example, the reset operation may be performed based on the final reset control signal generated based on the first and second reset control signals. Accordingly, the abnormal reset off in which the reset operation is unintentionally stopped may be prevented, and the storage device may be efficiently protected. For example, in the storage device supporting the power-loss protection operation, the unintentional reset off and the failure of a PLP dump operation may be prevented, the storage device may be protected from entering an error mode due to the blackout, and thus the storage device may have the improved or enhanced reliability.

Figure 2:
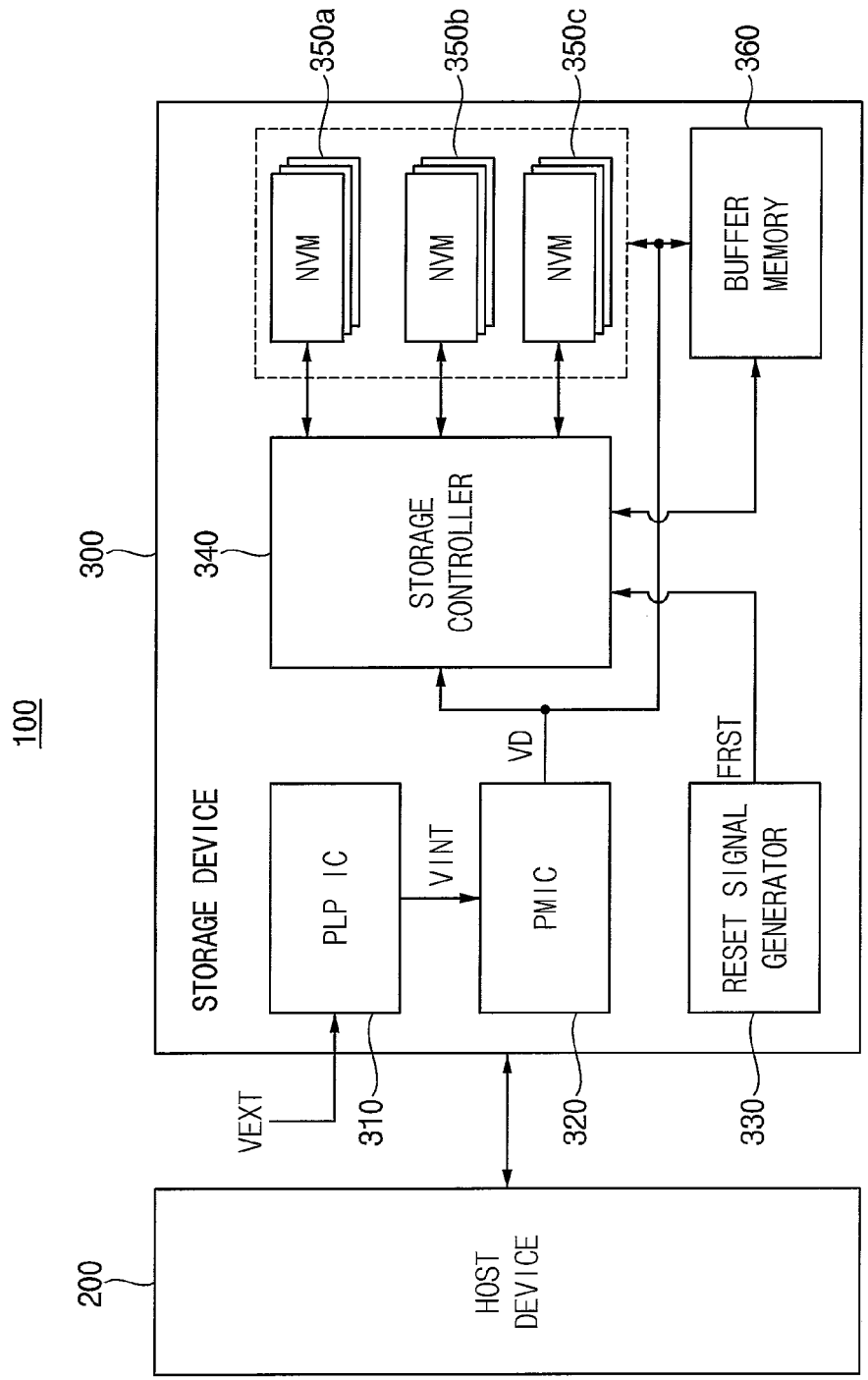
FIG. 2 is a block diagram illustrating a storage device and a storage system including the storage device according to example embodiments.

FIG. 2 is a block diagram illustrating a storage device and a storage system including the storage device according to example embodiments.

Referring to FIG. 2, a storage system 100 includes a host device 200 and a storage device 300.

The host device 200 controls overall operations of the storage system 100. Although not illustrated in FIG. 2, the host device 200 may include a host processor and a host memory. The host processor may control an operation of the host device 200. For example, the host processor may execute an operating system (OS). The host memory may store instructions and/or data that are executed and/or processed by the host processor. For example, the operating system executed by the host processor may include a file system for file management and a device driver for controlling peripheral devices including the storage device 300 at the operating system level.

The storage device 300 is accessed by the host device 200. The storage device 300 includes a power-loss protection integrated circuit 310, a power management integrated circuit 320, a reset signal generator 330, a storage controller 340, a plurality of nonvolatile memories (NVMs) 350*a*, 350*b* and 350*c*, and a buffer memory 360.

The power-loss protection integrated circuit 310 generates an internal power supply voltage VINT based on an external power supply voltage VEXT. When the storage device 300 is powered off (e.g., in a case of a sudden power-off (SPO) in which the external power supply voltage VEXT is suddenly turned off, or in a case of a normal power-off in which the external power supply voltage VEXT is turned off), the internal power supply voltage VINT may be used as an auxiliary power supply voltage.

The power management integrated circuit 320 generates and controls at least one driving voltage VD that is supplied to the storage controller 340, the plurality of nonvolatile memories 350*a*, 350*b* and 350*c* and the buffer memory 360 based on one of the external power supply voltage VEXT and the internal power supply voltage VINT. For example, powers for driving the storage controller 340, the plurality of nonvolatile memories 350*a*, 350*b* and 350*c* and the buffer memory 360 may be controlled and regulated by the power management integrated circuit 320.

For example, the power management integrated circuit 320 may generate the driving voltage VD based on the external power supply voltage VEXT before the external power supply voltage VEXT is turned off. The power management integrated circuit 320 may generate the driving voltage VD based on the internal power supply voltage VINT after the external power supply voltage VEXT is turned off. Thus, the power management integrated circuit 320 may supply the driving voltage VD for a predetermined time interval even after the storage device 300 is powered off Although it is omitted for convenience of illustration, the power management integrated circuit 320 may receive the external power supply voltage VEXT, which will be described with reference to FIGS. 9 and 16.

The reset signal generator 330 generates a final reset control signal FRST that is provided to the storage controller 340. Detailed configurations of the reset signal generator 330 will be described with reference to FIGS. 9 and 16.

The storage controller 340 may control an operation of the storage device 300 and/or operations of the plurality of nonvolatile memories 350a, 350b and 350c based on a command and data that are received from the host device 200.

The plurality of nonvolatile memories 350a, 350b and 350c may store a plurality of data. For example, the plurality of nonvolatile memories 350a, 350b and 350c may store meta data, various user data, or the like.

In some example embodiments, each of the plurality of nonvolatile memories 350a, 350b and 350c may include a NAND flash memory. In other example embodiments, each of the plurality of nonvolatile memories 350a, 350b and 350c may include one of an electrically erasable programmable read only memory (EEPROM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The buffer memory 360 may store instructions and/or data that are executed and/or processed by the storage controller 340, and may temporarily store data stored in or to be stored into the plurality of nonvolatile memories 350a, 350b and 350c. For example, the buffer memory 360 may include at least one of various volatile memories, e.g., a dynamic random access memory (DRAM), or the like.

The power-loss protection integrated circuit 310, the reset signal generator 330 and the storage controller 340 may perform the method described with reference to FIG. 1. For example, the power-loss protection integrated circuit 310 generates the internal power supply voltage VINT based on the external power supply voltage VEXT, the reset signal generator 330 generates the first and second reset control signals, and generates the final reset control signal FRST based on the first and second reset control signals, and the storage controller 340 performs a reset operation based on the final reset control signal FRST when the external power supply voltage VEXT is turned off. For example, the reset signal generator 330 may generate the final reset control signal FRST for preventing the abnormal reset off based on the two reset control signals, and thus may improve or enhance the reliability of the storage device 300. In addition, the power-loss protection integrated circuit 310, the reset signal generator 330 and the storage controller 340 may perform a method which will be described with reference to FIG. 20.

In some example embodiments, the power-loss protection integrated circuit 310, the power management integrated circuit 320, the reset signal generator 330 and the storage controller 340 may be formed of or implemented as separate chips. In some example embodiments, the reset signal generator 330 may be formed of or implemented as two or more chips. In some example embodiments, the storage controller 340, the plurality of nonvolatile memories 350a, 350b and 350c and the buffer memory 360 may be formed of or implemented as separate chips, or at least some of them may be formed of or implemented as a single chip.

In some example embodiments, the storage device 300 may be a solid state drive (SSD). In other example embodiments, the storage device 300 may be a universal flash storage (UFS), a multi media card (MMC) or an embedded multi media card (eMMC). In still other example embodiments, the storage device 300 may be one of a secure digital (SD) card, a micro SD card, a memory stick, a chip card, a universal serial bus (USB) card, a smart card, a compact flash (CF) card, or the like.

In some example embodiments, the storage device 300 may be connected to the host device 200 via a block accessible interface which may include, for example, a UFS, an eMMC, a serial advanced technology attachment (SATA) bus, a nonvolatile memory express (NVMe) bus, a serial attached SCSI (SAS) bus, or the like. The storage device 300 may use a block accessible address space corresponding to an access size of the plurality of nonvolatile memories 350a, 350b and 350c to provide the block accessible interface to the host device 200, for allowing the access by units of a memory block with respect to data stored in the plurality of nonvolatile memories 350a, 350b and 350c.

In some example embodiments, the storage system 100 may be any computing system, such as a personal computer (PC), a server computer, a data center, a workstation, a digital television, a set-top box, a navigation system, etc. In other example embodiments, the storage system 100 may be any mobile system, such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

Figure 3:
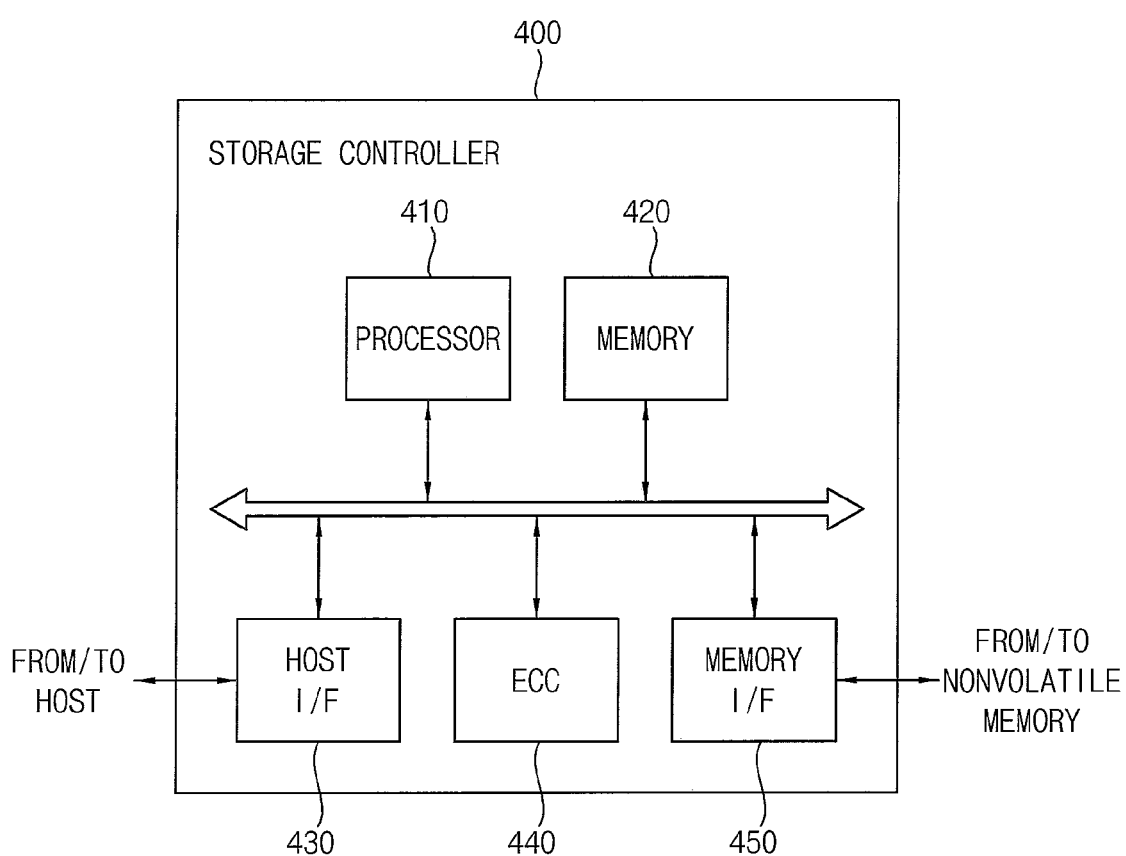
FIG. 3 is a block diagram illustrating a storage controller included in a storage device according to example embodiments.

FIG. 3 is a block diagram illustrating a storage controller included in a storage device according to example embodiments.

Referring to FIG. 3, a storage controller 400 may include at least one processor 410, a memory 420, a host interface 430, an error correction code (ECC) block 440 and a memory interface 450.

The processor 410 may control an operation of the storage controller 400 in response to a command received via the host interface 430 from a host device (e.g., the host device 200 in FIG. 2). In some example embodiments, the processor 410 may control respective components by employing firmware for operating a storage device (e.g., the storage device 300 in FIG. 2).

The memory 420 may store instructions and data executed and processed by the processor 410. For example, the memory 420 may be implemented with a volatile memory device with relatively small capacity and high speed, such as a static random access memory (SRAM), a cache memory, or the like.

The ECC block 440 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The host interface 430 may provide physical connections between the host device 200 and the storage device 300. The host interface 430 may provide an interface corresponding to a bus format of the host for communication between the host device 200 and the storage device 300. In some example embodiments, the bus format of the host device 200 may be a small computer system interface (SCSI) or a serial attached SCSI (SAS) interface. In other example embodiments, the bus format of the host device 200 may be a USB, a peripheral component interconnect (PCI) express (PCIe), an advanced technology attachment (ATA), a parallel ATA (PATA), a serial ATA (SATA), a nonvolatile memory (NVM) express (NVMe), etc., format.

The memory interface 450 may exchange data with nonvolatile memories (e.g., the nonvolatile memories 350a, 350b and 350c in FIG. 2). The memory interface 450 may transfer data to the nonvolatile memories 350a, 350b and 350c, or may receive data read from the nonvolatile memories 350a, 350b and 350c. In some example embodiments, the memory interface 450 may be connected to the nonvolatile memories 350a, 350b and 350c via one channel. In other example embodiments, the memory interface 450 may be connected to the nonvolatile memories 350a, 350b and 350c via two or more channels.

Figure 4:
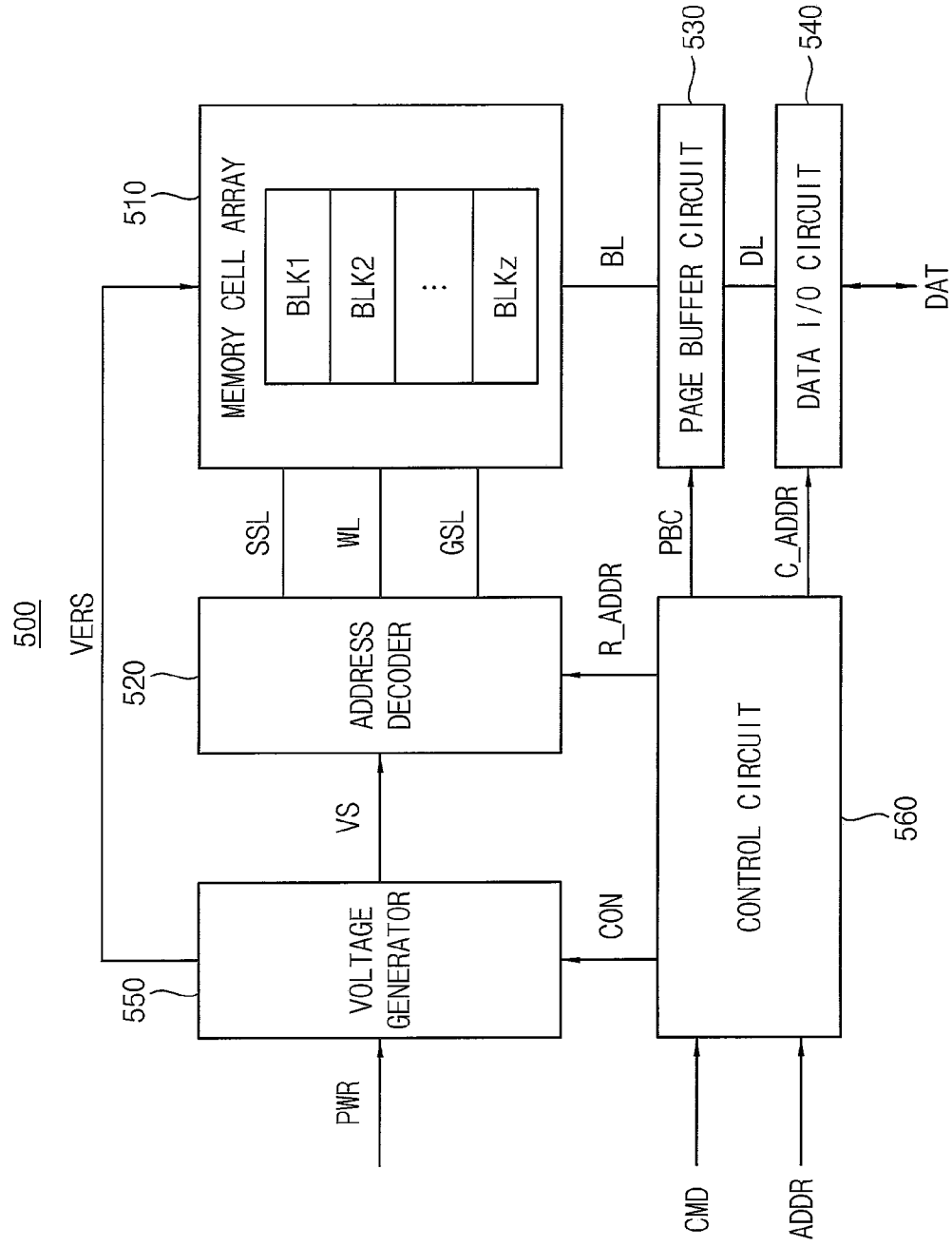
FIG. 4 is a block diagram illustrating a nonvolatile memory included in a storage device according to example embodiments.

FIG. 4 is a block diagram illustrating a nonvolatile memory included in a storage device according to example embodiments.

Referring to FIG. 4, a nonvolatile memory 500 includes a memory cell array 510, an address decoder 520, a page buffer circuit 530, a data input/output (I/O) circuit 540, a voltage generator 550 and a control circuit 560.

The memory cell array 510 is connected to the address decoder 520 via a plurality of string selection lines SSL, a plurality of wordlines WL and a plurality of ground selection lines GSL. The memory cell array 510 is further connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , and BLKz each of which includes memory cells. In addition, each of the plurality of memory blocks BLK1, BLK2, . . . , and BLKz may be divided into a plurality of pages.

In some example embodiments, the plurality of memory cells may be arranged in a two dimensional (2D) array structure or a three dimensional (3D) vertical array structure. A three-dimensional vertical array structure may include vertical cell strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and U.S. Pat. Pub. No. 2011/0233648.

The control circuit 560 receives a command CMD and an address ADDR from the outside (e.g., the host device 200 and/or the storage controller 340 in FIG. 2), and control erasure, program and read operations of the nonvolatile memory 500 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and a data recover read operation.

For example, the control circuit 560 may generate control signals CON, which are used for controlling the voltage generator 550, and may generate page buffer control signals PBC for controlling the page buffer circuit 530, based on the command CMD, and may generate a row address R_ADDR and a column address C_ADDR based on the address ADDR. The control circuit 560 may provide the row address R_ADDR to the address decoder 520 and may provide the column address C_ADDR to the data I/O circuit 540.

The address decoder 520 may be connected to the memory cell array 510 via the plurality of string selection lines SSL, the plurality of wordlines WL and the plurality of ground selection lines GSL.

For example, in the data erase/write/read operations, the address decoder 520 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 520 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 520 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 550 may generate voltages VS that are used for an operation of the nonvolatile memory 500 based on a power PWR and the control signals CON. The voltages VS may be applied to the plurality of string selection lines SSL, the plurality of wordlines WL and the plurality of ground selection lines GSL via the address decoder 520. In addition, the voltage generator 550 may generate an erase voltage VERS that is used for the data erase operation based on the power PWR and the control signals CON. The erase voltage VERS may be applied to the memory cell array 510 directly or via the bitline BL.

For example, during the erase operation, the voltage generator 550 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 520. In addition, during the erase verification operation, the voltage generator 550 may apply an erase verification voltage simultaneously to all wordlines of the memory block or sequentially to the wordlines one by one.

For example, during the program or write operation, the voltage generator 550 may apply a program voltage to the selected wordline and may apply a program pass voltage to the unselected wordlines via the address decoder 520. In addition, during the program verification operation, the voltage generator 550 may apply a program verification voltage to the selected wordline and may apply a verification pass voltage to the unselected wordlines via the address decoder 520.

In addition, during the normal read operation, the voltage generator 550 may apply a read voltage to the selected wordline and may apply a read pass voltage to the unselected wordlines via the address decoder 520. During the data recover read operation, the voltage generator 550 may apply the read voltage to a wordline adjacent to the selected wordline and may apply a recover read voltage to the selected wordline via the address decoder 520.

The page buffer circuit 530 may be connected to the memory cell array 510 via the plurality of bitlines BL. The page buffer circuit 530 may include a plurality of page buffers. In some example embodiments, each page buffer may be connected to one bitline. In other example embodiments, each page buffer may be connected to two or more bitlines.

The page buffer circuit 530 may store data DAT to be programmed into the memory cell array 510 or may read data DAT sensed from the memory cell array 510. For example, the page buffer circuit 530 may operate as a write driver or a sensing amplifier according to an operation mode of the nonvolatile memory 500.

The data I/O circuit 540 may be connected to the page buffer circuit 530 via data lines DL. The data I/O circuit 540 may provide the data DAT from an outside of the nonvolatile memory 500 to the memory cell array 510 via the page buffer circuit 530 or may provide the data DAT from the memory cell array 510 to the outside of the nonvolatile memory 500, based on the column address C_ADDR.

Figure 5:
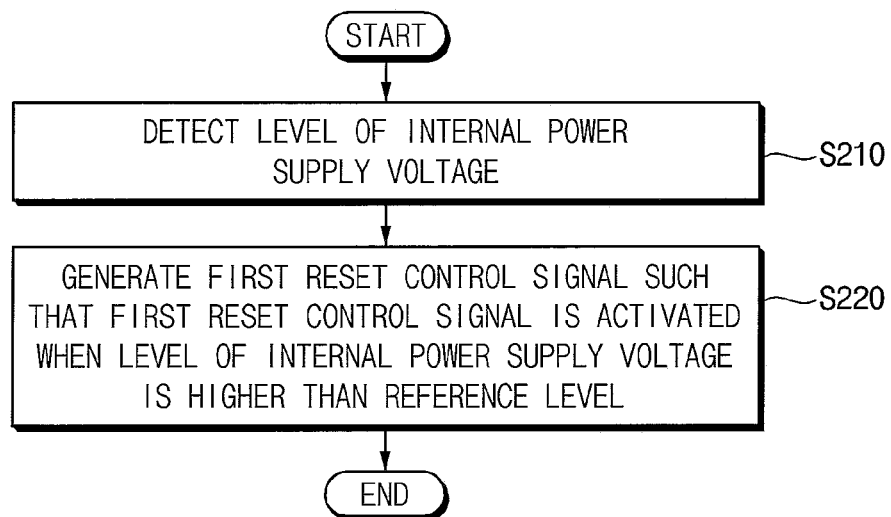
FIG. 5 is a flowchart illustrating an example of generating a first reset control signal in FIG. 1 according to example embodiments.

FIG. 5 is a flowchart illustrating an example of generating a first reset control signal in FIG. 1 according to example embodiments.

Referring to FIGS. 1 and 5, when generating the first reset control signal (step S200), the level of the internal power supply voltage may be detected (step S210), and the first reset control signal may be generated such that the first reset control signal is activated when the level of the internal power supply voltage is higher than a reference level (step S220). Detailed configurations for performing steps S210 and S220 will be described with reference to FIGS. 9 and 11.

In some example embodiments, as will be described with reference to FIG. 13, the internal power supply voltage may have a first level that is equal to a level of the external power supply voltage before the external power supply voltage is turned off, and the internal power supply voltage may have a second level that is lower than the first level after the external power supply voltage is turned off. For example, the reference level may be lower than the second level. The first reset control signal may be deactivated when the level of the internal power supply voltage is lower than or equal to the reference level. In some examples, the internal power supply voltage may be instantaneously lower than the reference level after the external power supply voltage is turned off, and the first reset control signal may be instantaneously deactivated.

Figure 6:
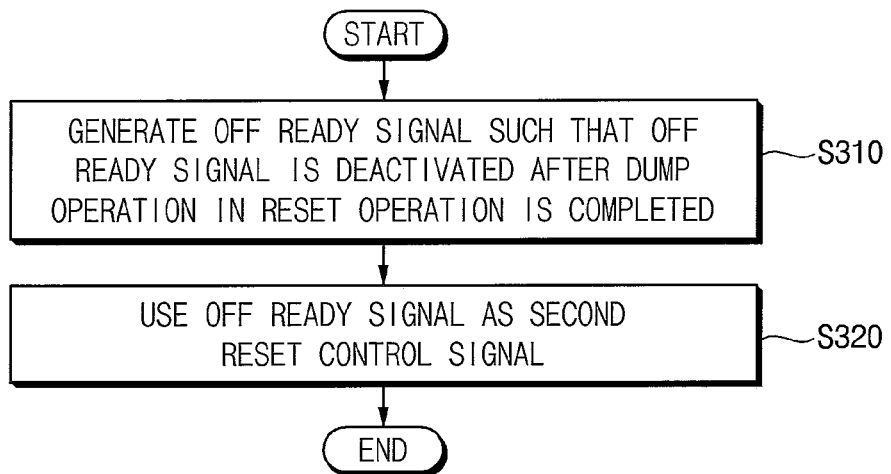
FIG. 6 is a flowchart illustrating an example of generating a second reset control signal in FIG. 1 according to example embodiments.

FIG. 6 is a flowchart illustrating an example of generating a second reset control signal in FIG. 1 according to example embodiments.

Referring to FIGS. 1 and 6, when generating the second reset control signal (step S300), the second reset control signal may be an off ready signal that is provided from the storage controller. The off ready signal may be a signal representing that the reset operation is completed. For example, the off ready signal may be deactivated when the reset operation is completed. For example, the off ready signal may be a signal representing that the power is not required to be supplied to the storage controller (or the storage device) and an operation of the storage controller (or the storage device) can be normally terminated.

For example, the off ready signal may be generated such that the off ready signal is deactivated after a dump operation in the reset operation is completed (step S310), and the off ready signal may be used as the second reset control signal (step S320). Steps S310 and S320 may be performed by the storage controller. For example, the reset operation in step S310 may include the dump (or, PLP dump) operation and the dump operation will be described with reference to FIG. 8.

In some example embodiments, as will be described with reference to FIG. 13, the off ready signal may maintain an activation state (or may continue to be activated) even when the external power supply voltage is turned off, and may be deactivated after a predetermined time elapses after the external power supply voltage is turned off.

Figure 7:
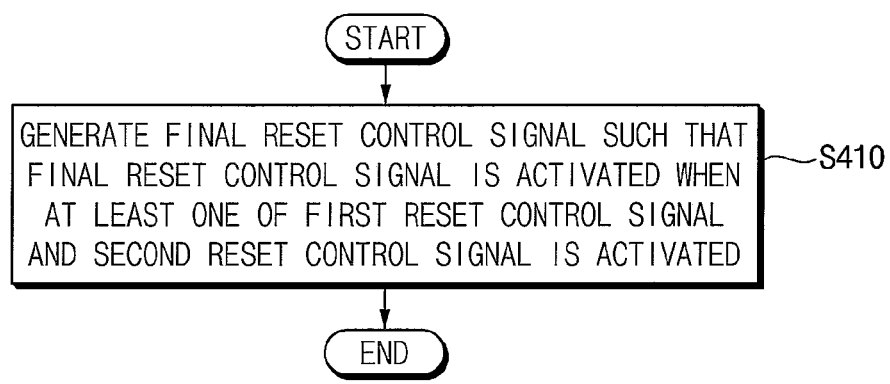
FIG. 7 is a flowchart illustrating an example of generating a final reset control signal in FIG. 1 according to example embodiments.

FIG. 7 is a flowchart illustrating an example of generating a final reset control signal in FIG. 1 according to example embodiments.

Referring to FIGS. 1 and 7, when generating the final reset control signal (step S400), the final reset control signal may be generated such that the final reset control signal is activated when at least one of the first reset control signal and the second reset control signal is activated (step S410). Detailed configurations for performing step S410 will be described with reference to FIGS. 9 and 12.

Figure 8:
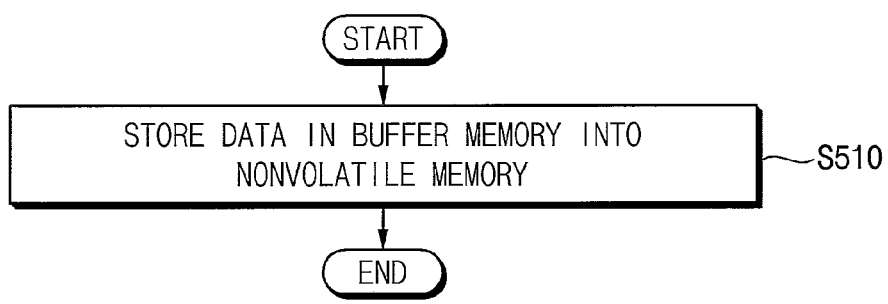
FIG. 8 is a flowchart illustrating an example of performing a reset operation in FIG. 1 according to example embodiments.

FIG. 8 is a flowchart illustrating an example of performing a reset operation in FIG. 1 according to example embodiments.

Referring to FIGS. 1 and 8, when performing the reset operation (step S500), data stored in the buffer memory may be stored (e.g., moved or copied) into the nonvolatile memory (step S510). The operation performed in step S510 may be referred to as the PLP dump operation. However, the invention is not limited thereto, and the reset operation may further include at least one operation for normally terminating the operation of the storage controller (or the storage device).

In some example embodiments, the final reset control signal may be provided to the storage controller. The storage controller may perform the reset operation based on the final reset control signal before the level of the internal power supply voltage becomes lower than the reference level.

As described with reference to FIG. 5, the internal power supply voltage may be instantaneously lower than the reference level after the external power supply voltage is turned off, and the first reset control signal may be instantaneously deactivated. In contrast, as described with reference to FIG. 6, the second reset control signal (e.g., the off ready signal) may maintain the activation state for a predetermined time interval even after the external power supply voltage is turned off. Thus, when the final reset control signal is generated to be activated when at least one of the first and second reset control signals is activated as described with reference to FIG. 7, and when the reset operation is performed based on the final reset control signal as described with reference to FIG. 8, the abnormal reset off in which the reset operation is unintentionally stopped may be efficiently prevented.

Figure 9:
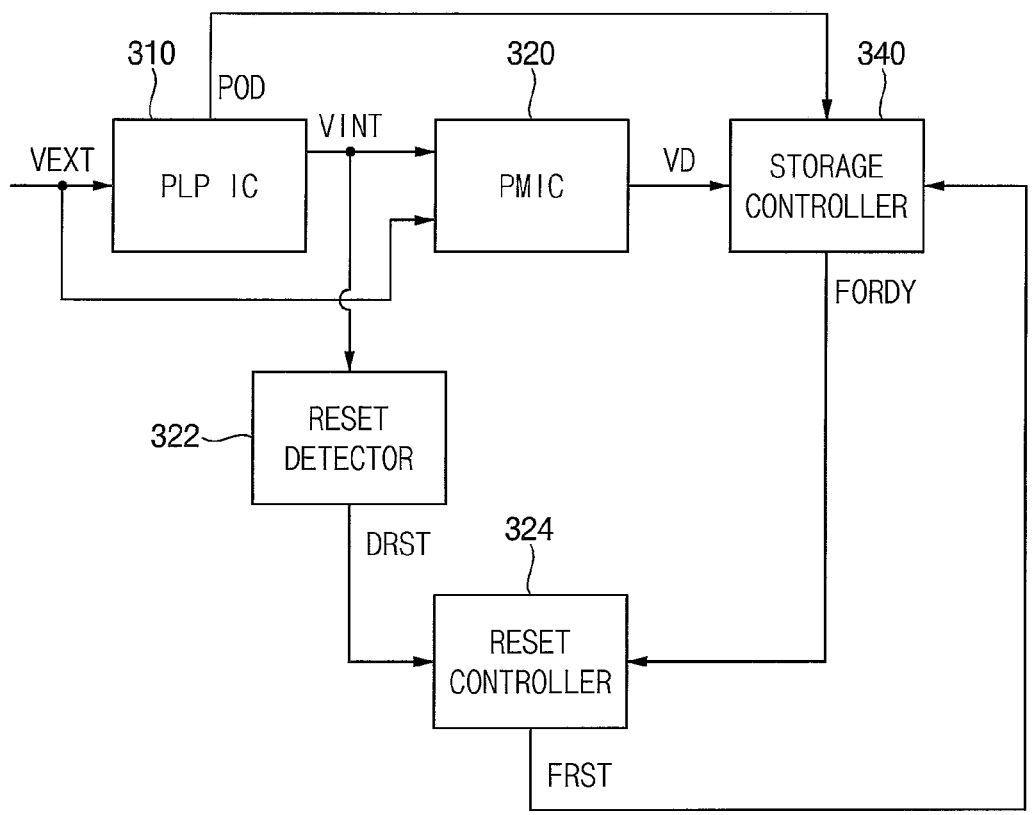
FIG. 9 is a block diagram illustrating a storage device of FIG. 2 according to example embodiments.

FIG. 9 is a block diagram illustrating a storage device of FIG. 2 according to example embodiments.

Referring to FIG. 9, a storage device 302 includes a power-loss protection integrated circuit 310, a power management integrated circuit 320, a reset detector 322, a reset controller 324 and a storage controller 340. For convenience of illustration, the nonvolatile memories 350*a*, 350*b* and 350*c* and the buffer memory 360 in FIG. 2 are omitted.

The power-loss protection integrated circuit 310 may generate the internal power supply voltage VINT based on the external power supply voltage VEXT. For example, the power-loss protection integrated circuit 310 may perform step S100 in FIG. 1. In addition, the power-loss protection integrated circuit 310 may generate a power off detection signal POD based on the internal power supply voltage VINT. For example, the power off detection signal POD may be deactivated based on a level of the internal power supply voltage VINT when the external power supply voltage VEXT is turned off and may represent that the external power supply voltage VEXT is turned off. A detailed configuration of the power-loss protection integrated circuit 310 will be described with reference to FIG. 10.

The power management integrated circuit 320 may generate and control the at least one driving voltage VD based on one of the external power supply voltage VEXT and the internal power supply voltage VINT. In addition, although not illustrated in FIG. 9, the power management integrated circuit 320 may exchange at least one signal for controlling and regulating the driving voltage VD with the storage controller 340.

The reset detector 322 may generate a first reset control signal DRST such that the first reset control signal DRST is activated or deactivated based on the level of the internal power supply voltage VINT. For example, the reset detector 322 may perform step S200 in FIG. 1. The first reset control signal DRST may be referred to as a default reset control signal. A detailed configuration of the reset detector 322 will be described with reference to FIG. 11.

The reset controller 324 may generate the final reset control signal FRST based on the first reset control signal DRST and an off ready signal FORDY. The final reset control signal FRST may be activated or deactivated with a timing different from those of the first reset control signal DRST and the off ready signal FORDY. For example, the reset controller 324 may perform step S400 in FIG. 1. An example of FIG. 9 illustrates a case where the off ready signal FORDY is used as a second reset control signal. In some example embodiments, the off ready signal FORDY may be activated after the external power supply voltage VEXT is turned on (e.g., power-on). A detailed configuration of the reset controller 324 will be described with reference to FIG. 12.

In the example of FIG. 9, the reset detector 322 and the reset controller 324 may form the reset signal generator 330 in FIG. 2. In some example embodiments, the reset detector 322 and the reset controller 324 may be formed as separate chips, or may be integrated into one chip.

The storage controller 340 may control an operation of the storage device 302, may operate based on the driving voltage VD, and may generate the off ready signal FORDY that is activated or deactivated with a timing different from that of the first reset control signal DRST. In addition, the storage controller 340 may receive the power off detection signal POD, may check whether the external power supply voltage VEXT is turned off based on the power off detection signal POD, and may perform the reset operation based on the final reset control signal FRST and the power off detection signal POD when the external power supply voltage VEXT is turned off. For example, the storage controller 340 may perform steps S300 and S500 in FIG. 1, and step S300 may be performed based on an example of FIG. 6. The off ready signal FORDY may be a signal representing that the PLP dump operation is completed, and may be referred to as a firmware off ready signal.

In some example embodiments, as described with reference to FIG. 8, the reset operation may include an operation of storing (or moving) data stored in the buffer memory 360 into the nonvolatile memories 350a, 350b and 350c. When the external power supply voltage VEXT is turned off, the storage controller 340 may perform the reset operation based on the driving voltage VD generated based on the internal power supply voltage VINT.

When the external power supply voltage VEXT is not turned off, the storage controller 340 may perform a normal operation based on the driving voltage VD generated based on the external power supply voltage VEXT. For example, the normal operation may include program/read/erase operations, a garbage collection operation, or the like.

Figure 10:
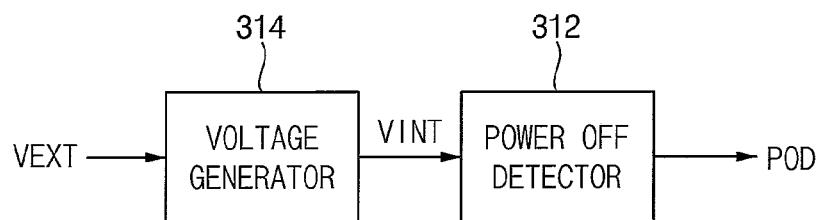
FIG. 10 is a block diagram illustrating a power-loss protection integrated circuit included in a storage device of FIG. 9 according to example embodiments.

FIG. 10 is a block diagram illustrating a power-loss protection integrated circuit included in a storage device of FIG. 9 according to example embodiments.

Referring to FIG. 10, a power-loss protection integrated circuit 310a may include a power off detector 312 and a voltage generator 314.

The power off detector 312 may generate the power off detection signal POD based on the internal power supply voltage VINT. For example, the power off detector 312 may include a voltage level detector that detects the level of the internal power supply voltage VINT.

The voltage generator 314 may generate the internal power supply voltage VINT based on the external power supply voltage VEXT. For example, the level of the internal power supply voltage VINT may be lower than or equal to the level of the external power supply voltage VEXT. For example, the voltage generator 314 may include at least one capacitor that stores electric charges for generating the internal power supply voltage VINT. In some example embodiments, the voltage generator 314 may generate the internal power supply voltage VINT having a predetermined level for a predetermined time after the external power supply voltage VEXT is turned off. The operation of the voltage generator 314 will be described with reference to FIGS. 13 and 18.

Figure 11:
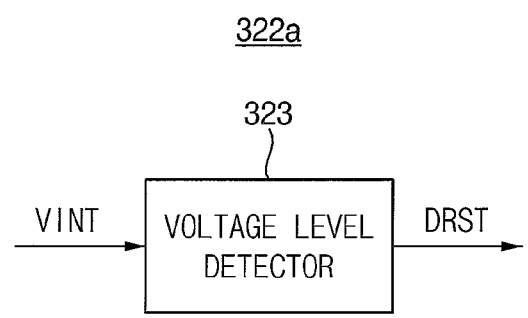
FIG. 11 is a block diagram illustrating a reset detector included in a storage device of FIG. 9 according to example embodiments.

FIG. 11 is a block diagram illustrating a reset detector included in a storage device of FIG. 9 according to example embodiments.

Referring to FIG. 11, a reset detector 322a may include a voltage level detector 323.

The voltage level detector 323 may detect the level of the internal power supply voltage VINT, and may generate the first reset control signal DRST such that the first reset control signal DRST is activated when the level of the internal power supply voltage VINT is higher than the reference level. For example, the voltage level detector 323 may be a low voltage level detector that detects whether the level of the internal power supply voltage VINT is lower than or equal to the reference level. However, the invention is not limited thereto.

Figure 12:
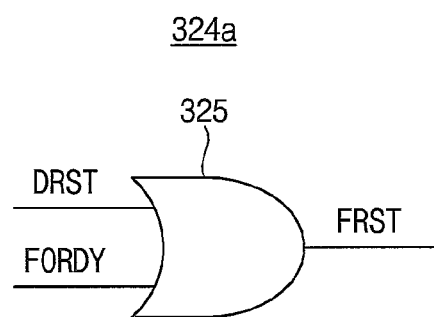
FIG. 12 is a block diagram illustrating a reset controller included in a storage device of FIG. 9 according to example embodiments.

FIG. 12 is a block diagram illustrating a reset controller included in a storage device of FIG. 9 according to example embodiments.

Referring to FIG. 12, a reset controller 324a may include an OR gate 325.

The OR gate 325 may generate the final reset control signal FRST by performing an OR operation on the first reset control signal DRST and the off ready signal FORDY that is the second reset control signal. However, the invention is not limited thereto, and the reset controller 324a may include at least one of various logic gates.

Figure 13:
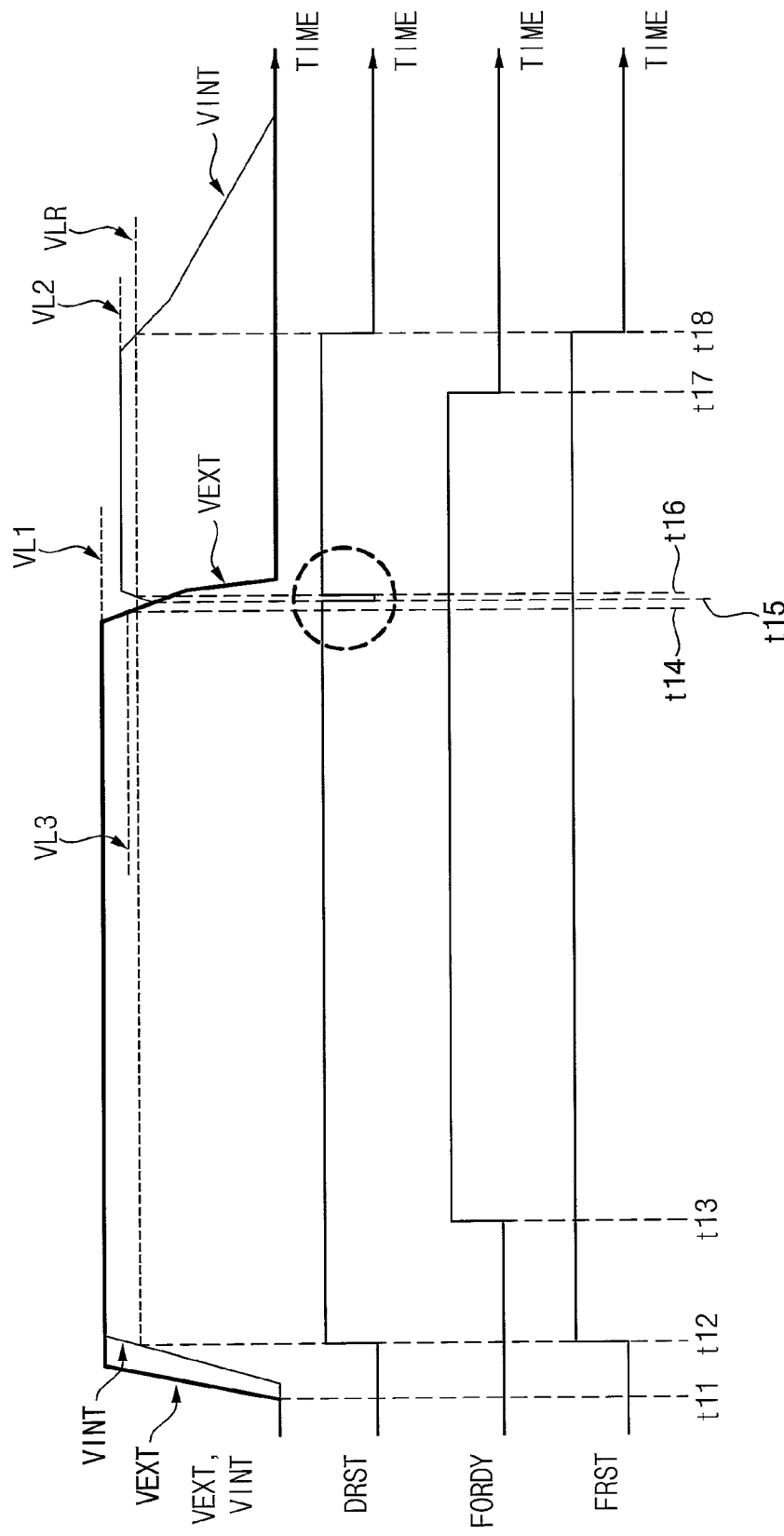
FIGS. 13 and 14 are diagrams for describing an operation of a storage device of FIG. 9 according to example embodiments.
Figures 14, 15:
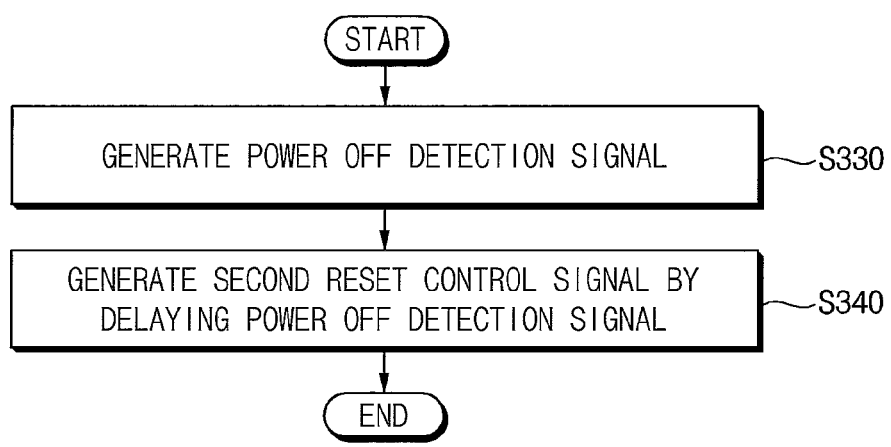
FIG. 15 is a flowchart illustrating a generation of a second reset control signal in FIG. 1 according to example embodiments.

FIGS. 13 and 14 are diagrams for describing an operation of a storage device of FIG. 9 according to example embodiments.

Referring to FIG. 13, waveforms of the external power supply voltage VEXT, the internal power supply voltage VINT, the first reset control signal DRST, the off ready signal FORDY and the final reset control signal FRST are illustrated.

In FIG. 13 and subsequent figures, a rising edge at which each signal is transitioned from a logic low level (e.g., "0") to a logic high level (e.g., "1") is defined as an activation time point of each signal, and a falling edge at which each signal is transitioned from the logic high level to the logic low level is defined as a deactivation time point of each signal. Thus, a deactivation state or level may represent that each signal has the logic low level, and an activation state or level may represent that each signal has the logic high level. However, the invention is not limited thereto, and the activation and/or deactivation of each signal may be implemented based on various schemes.

At a time point t11, when a power-on operation of the storage device or the storage controller is started, the external power supply voltage VEXT may be turned on, and the external power supply voltage VEXT may increase or rise from a ground level to a first level VL1. For example, the ground level may be about 0V, and the first level VL1 may be about 3.3V. As the external power supply voltage VEXT is turned on, the internal power supply voltage VINT may also increase from the ground level to the first level VL1.

Due to the operation and/or delay of elements included in the voltage generator (e.g., the voltage generator 314 in FIG. 10) that generates the internal power supply voltage VINT, there may be a time difference between a time point at which the level of the external power supply voltage VEXT starts to increases and a time point at which the level of the internal power supply voltage VINT starts to increases, and a level increment rate of the external power supply voltage VEXT and a level increment rate of the internal power supply voltage VINT may also be different from each other. While the external power supply voltage VEXT is turned on (e.g., before the external power supply voltage VEXT is turned off), the level of the external power supply voltage VEXT and the level of the internal power supply voltage VINT may be maintained the first level VL1.

In addition, during an initial operation time interval (or, a power-on initial reset interval) from the time point t11 to a time point t12, both the first reset control signal DRST and the off ready signal FORDY may have the deactivation state, and the final reset control signal FRST may also have the deactivation state.

At the time point t12, the level of the internal power supply voltage VINT may become higher than a reference level VLR. For example, the reference level VLR may be about 2.6V. Thus, the first reset control signal DRST may be activated, and the final reset control signal FRST may also be activated. The power-on operation of the storage device or the storage controller may be completed after the time point t12.

At a time point t13, a booting operation of the storage controller 340 may be completed, the firmware may be opened (or, ready), and thus the off ready signal FORDY may be activated. In this case, the final reset control signal FRST may maintain the activation state. The host device may control the storage device or the storage controller to perform a normal operation from the time point t13. In some examples, the time interval between the time point t11 and the time point t13 is several hundred milliseconds to several seconds.

During a time interval from the time point t13 to a time point t14, the storage controller 340 may perform the normal operation based on the driving voltage VD generated based on the external power supply voltage VEXT.

Figure 18:
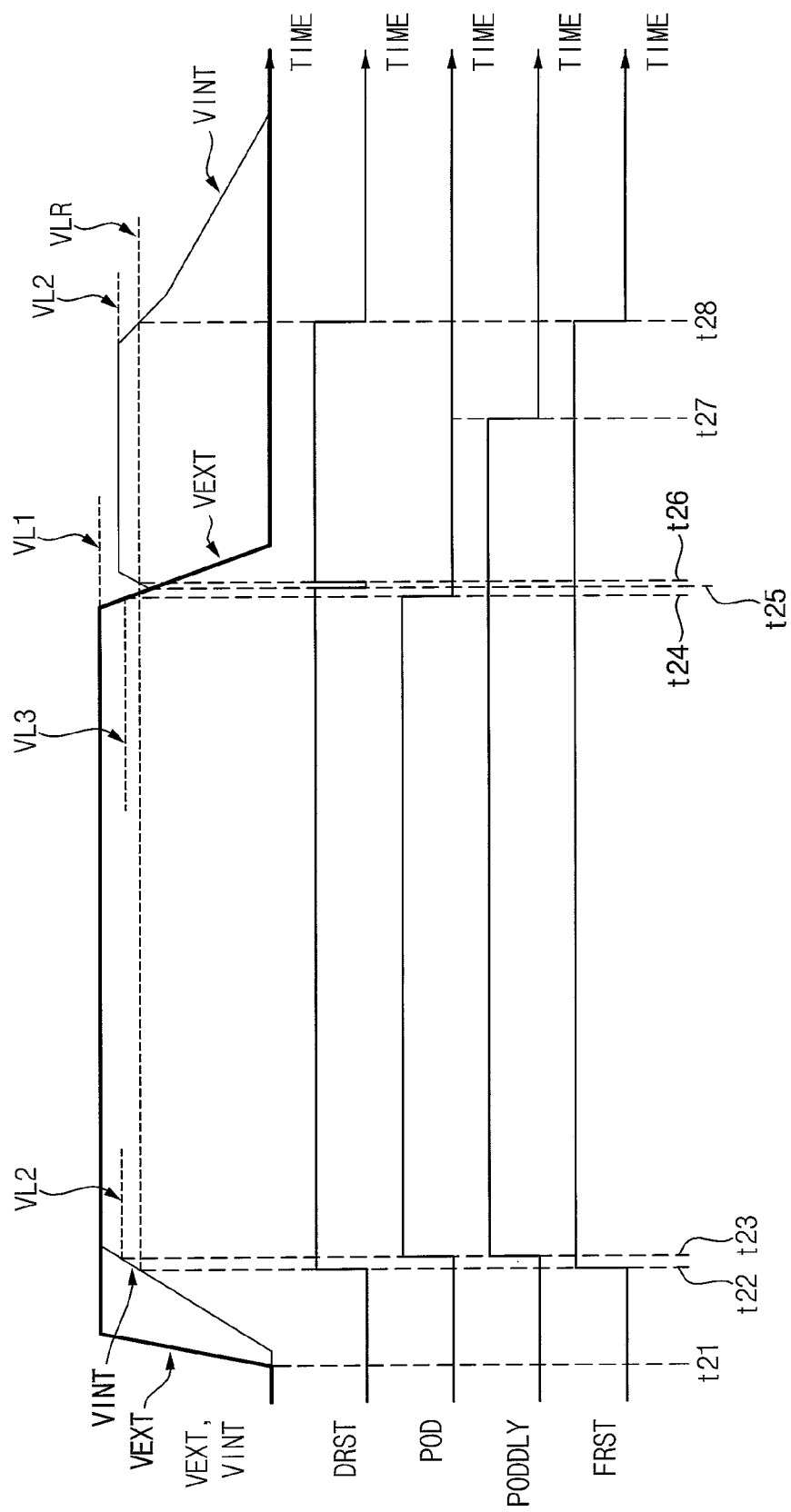

At the time point t14, the external power supply voltage VEXT may be turned off, and the external power supply voltage VEXT may decrease, drop or fall from the first level VL1 to the ground level. The reset operation of the storage device may be performed after the time point t14. Although not illustrated in FIG. 13, the power off detection signal POD may be deactivated based on a level of the internal power supply voltage VINT when the external power supply voltage VEXT is turned off, as illustrated in FIG. 18.

As the external power supply voltage VEXT is turned off at the time point t14, the operation mode associated with the internal power supply voltage VINT may be changed, converted or switched from a first mode in which the internal power supply voltage VINT has the first level VL1 equal to the level of the external power supply voltage VEXT to a second mode in which the internal power supply voltage VINT has a second level VL2 lower than the first level VL1 and higher than the reference level VLR. For example, the second level VL2 may be about 3.0V. For example, in the first mode, the external power supply voltage VEXT may be output as the internal power supply voltage VINT. In the second mode, the internal power supply voltage VINT may be generated using, for example, the capacitor included in the voltage generator 314 in FIG. 10. The above-described switching for the operation mode associated with the internal power supply voltage VINT may be referred to as a PLP mode switching operation.

In some example embodiments, the internal power supply voltage VINT may have a third level VL3 lower than the second level VL2 at the time point t14. For example, the third level VL3 is 2.8V~2.9V.

A certain time (or delay) may be needed when the above-described switching for the operation mode is performed, and an instantaneous voltage drop (or voltage dip) may occur on the internal power supply voltage VINT. For example, at the time point t14, the level of the internal power supply voltage VINT may decrease in the same manner as the external power supply voltage VEXT because the switching for the operation mode has not been completed yet. At a time point t15, the level of the internal power supply voltage VINT may become lower than the reference level VLR. After that, when the switching for the operation mode is completed, the level of the internal power supply voltage VINT may increase. At a time point t16, the level of the internal power supply voltage VINT may become higher than the reference level VLR. After that, the internal power supply voltage VINT may increase to the second level VL2 and may maintain the second level VL2 during a predetermined period of time.

As described above, when the instantaneous voltage drop occurs on the internal power supply voltage VINT, the first reset control signal DRST may be deactivated at the time point t15, and then the first reset control signal DRST may be activated again at the time point t16 (a portion indicated by a dotted circle). However, even in this case, the off ready signal FORDY may maintain the activation state, and thus the final reset control signal FRST may maintain the activation state. Thus, the performing of the reset operation may be maintained during the interval between the time point t15 and the time point t16.

When the external power supply voltage VEXT is turned off at the time point t14, the storage controller 340 may check that the external power supply voltage VEXT is turned off based on the power off detection signal POD, and may perform the reset operation based on the driving voltage VD generated based on the final reset control signal FRST and the internal power supply voltage VINT.

At a time point t17, the PLP dump operation of the reset operation may be completed, and thus the off ready signal FORDY may be deactivated. For example. the interval between the time pint t14 and the time point t17 may be determined by the storage controller or users. The deactivation of the off ready signal FORDY may represent that the firmware can be terminated. However, even in this case, the first reset control signal DRST may maintain the activation state, and thus the final reset control signal FRST may maintain the activation state and operations other than the PLP dump operation of the reset operation may be performed after the time point t17.

After the PLP dump operation is completed, the internal power supply voltage VINT may start to gradually decrease. At a time point t18, the level of the internal power supply voltage VINT may become lower than the reference level VLR, and thus the first reset control signal DRST may be deactivated. Since the off ready signal FORDY also has the deactivation state, the final reset control signal FRST may be deactivated. For example, the reset operation may be terminated when the final reset control signal FRST is deactivated at the time point t18.

Referring to FIG. 14, a logic level of the final reset control signal FRST that is output from the reset controller 324 depending on logic levels of the first reset control signal DRST and the off ready signal FORDY that are input to the reset controller 324 is illustrated.

The final reset control signal FRST may have the logic low level (e.g., "0") only in a case of CASE11 in which both the first reset control signal DRST and the off ready signal FORDY have the logic low level. The final reset control signal FRST may have the logic high level (e.g., "1") in cases of CASE12, CASE13 and CASE14 in which at least one of the first reset control signal DRST and the off ready signal FORDY has the logic high level.

In some example embodiments, CASE11 may correspond to the interval before the power-on and the power-on initial reset interval before the firmware is opened (e.g., before the time point t12 in FIG. 13), and may correspond to the interval in which the PLP dump operation is completed and the first reset control signal DRST is deactivated (e.g., after the time point t18 in FIG. 13). CASE12 may correspond to the PLP mode switching interval or the interval in which only the first reset control signal DRST is deactivated (e.g., from the time point t15 to the time point t16 in FIG. 13). CASE13 may correspond to the interval before the firmware is opened (e.g., from the time point t12 to the time point t13 in FIG. 13), and may correspond to the interval in which the PLP dump operation is completed and the first reset control signal DRST is activated (e.g., from the time point t17 to the time point t18 in FIG. 13). CASE14 may correspond to the normal operation interval after the firmware is opened (e.g., from the time point t13 to the time point t15 in FIG. 13), and may correspond to the PLP dump interval (e.g., from the time point t16 to the time point t17 in FIG. 13).

In the storage device and the method of resetting the storage device according to example embodiments, the PLP dump operation may be performed based on the final reset control signal FRST generated based on the first reset control signal DRST and the off ready signal FORDY. Therefore, in the case of CASE12 (e.g., between the time point t15 and the time point t16 in FIG. 13), the risk filtering for the abnormal reset off may be performed and the abnormal reset off may be prevented.

FIG. 15 is a flowchart illustrating a generation of a second reset control signal in FIG. 1 according to example embodiments.

Referring to FIGS. 1 and 15, when generating the second reset control signal (step S300), the second reset control signal may be generated based on the power off detection signal POD that is provided from the power-loss protection integrated circuit. The power off detection signal may be a signal representing that the external power supply voltage is turned off.

For example, the power off detection signal may be generated (step S330), and the second reset control signal may be generated by delaying the power off detection signal (step S340). For example, the second reset control signal may be generated by delaying one of a rising edge and a falling edge of the power off detection signal. Detailed configurations for performing steps S330 and S340 will be described with reference to FIGS. 16 and 17.

In some example embodiments, as will be described with reference to FIG. 18, the power off detection signal may be deactivated based on a level of the internal power supply voltage VINT when the external power supply voltage is turned off.

Figure 16:
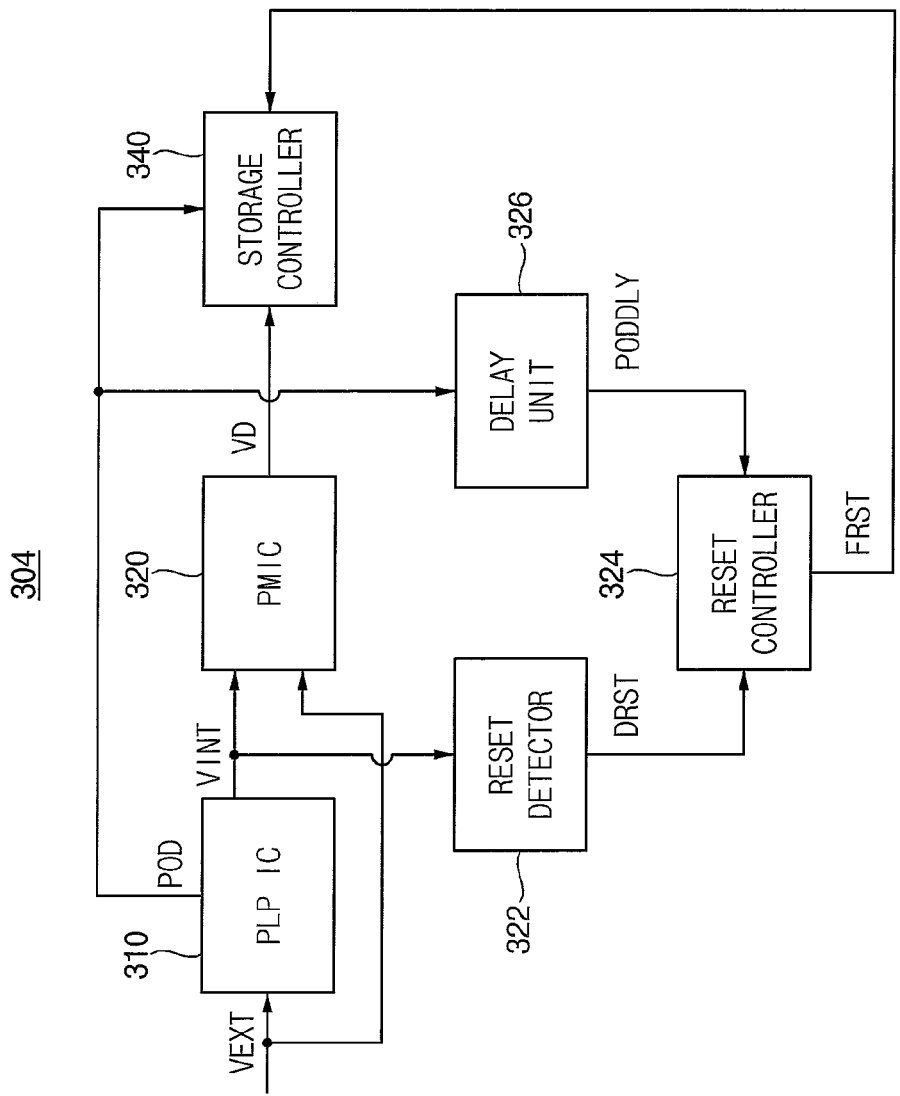
FIG. 16 is a block diagram illustrating a storage device of FIG. 2 according to other example embodiments.

FIG. 16 is a block diagram illustrating a storage device of FIG. 2 according to other example embodiments. The descriptions repeated with FIG. 9 will be omitted.

Referring to FIG. 16, a storage device 304 includes a power-loss protection integrated circuit 310, a power management integrated circuit 320, a reset detector 322, a reset controller 324, a delay unit 326 and a storage controller 340.

The storage device 304 may be the same as the storage device 302 of FIG. 9, except that the storage controller 340 does not generate the off ready signal FORDY and the storage device 304 further includes the delay unit 326 that generates a second reset control signal PODDLY The delay unit 326 may generate the second reset control signal PODDLY by delaying the power off detection signal POD. For example, the delay unit 326 may perform step S300 of FIG. 1, and step S300 may be performed based on an example of FIG. 15. For example, the second reset control signal PODDLY may be referred to as a delayed power off detection signal. An example of FIG. 16 illustrates a case where the second reset control signal PODDLY is generated based on the power off detection signal POD. A detailed configuration of the delay unit 326 will be described with reference to FIG. 17.

The reset controller 324 may generate the final reset control signal FRST based on the first reset control signal DRST and the second reset control signal PODDLY. The reset controller 324 may be implemented as described with reference to FIG. 12, except that the off ready signal FORDY is changed to the second reset control signal PODDLY.

In the example of FIG. 16, the reset detector 322, the reset controller 324 and the delay unit 326 may form the reset signal generator 330 in FIG. 2. In some example embodiments, the reset detector 322, the reset controller 324 and the delay unit 326 may be formed as separate chips, or at least two of them may be integrated into one chip.

Figure 17:
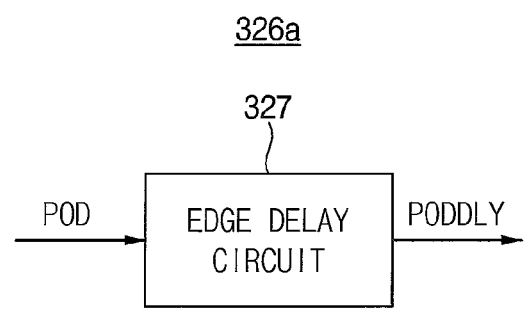
FIG. 17 is a block diagram illustrating a delay unit included in a storage device of FIG. 16 according to example embodiments.

FIG. 17 is a block diagram illustrating a delay unit included in a storage device of FIG. 16 according to example embodiments.

Referring to FIG. 17, a delay unit 326*a* may include an edge delay circuit 327.

The edge delay circuit 327 may generate the second reset control signal PODDLY by delaying one of a rising edge and a falling edge of the power off detection signal POD. For example, the edge delay circuit 327 may be a falling edge delay circuit that delays only a falling edge of the power off detection signal POD. However, the invention is not limited thereto.

FIGS. 18 and 19 are diagrams for describing an operation of a storage device of FIG. 16 according to example embodiments. The descriptions repeated with FIGS. 13 and 14 will be omitted.

Referring to FIG. 18, waveforms of the external power supply voltage VEXT, the internal power supply voltage VINT, the first reset control signal DRST, the power off detection signal POD, the second reset control signal PODDLY and the final reset control signal FRST are illustrated.

Operations at time points t21 and t22 may be the same as the operations at the time points t11 and t12 in FIG. 13.

At a time point t23, when the power-on operation of the storage device or the storage controller is completed, the power off detection signal POD may be activated, and thus the second reset control signal PODDLY may also be activated. The final reset control signal FRST may maintain the activation state.

In some example embodiments, a level of the internal power supply voltage VINT may be equal to the second level VL2 at the time point t23. For example, the level of the internal power supply voltage VINT may be 3V at the time point t23.

Operations at time points t24, t25 and t26 may be the same as the operations at the time points t14, t15 and t16 in FIG. 13.

As the external power supply voltage VEXT is turned off at the time point t24, the power off detection signal POD may be deactivated. In some example embodiments, the internal power supply voltage VINT may have a third level VL3 lower than the second level VL2 and higher than the reference level VLR at the time point t24. For example, the third level VL3 of the internal power supply voltage VINT may be 2.8V~2.9V. The second reset control signal PODDLY may not be deactivated at the time point t24, the falling edge of the second reset control signal PODDLY may be delayed by a predetermined time by the edge delay circuit (e.g., the edge delay circuit 327 in FIG. 17), and the second reset control signal PODDLY may be deactivated at a time point t27. Thus, the performing of the reset operation may be maintained during the interval between the time point t25 and the time point t26.

In some example embodiments, a time interval from the time point t24 at which the external power supply voltage VEXT is turned off to the time point t27 at which the second reset control signal PODDLY is deactivated may be the same as a maximum PLP execution time used to perform the PLP dump operation.

An operation at a time point t28 may be the same as the operation at the time point t18 in FIG. 13.

Referring to FIG. 19, a logic level of the final reset control signal FRST that is output from the reset controller 324 depending on logic levels of the first reset control signal DRST and the second reset control signal PODDLY that are input to the reset controller 324 is illustrated.

CASE21, CASE22, CASE23 and CASE24 may be the same as CASE11, CASE12, CASE13 and CASE14, respectively, in FIG. 14.

In some example embodiments, as with CASE11 in FIG. 14, CASE21 may correspond to the interval before the power-on and the power-on initial reset interval (e.g., before the time point t22 in FIG. 18), and may correspond to the interval in which the PLP dump operation is completed and the first reset control signal DRST is deactivated (e.g., after the time point t28 in FIG. 18). As with CASE12 in FIG. 14, CASE22 may correspond to the PLP mode switching interval or the interval in which only the first reset control signal DRST is deactivated (e.g., from the time point t25 to t26 in FIG. 18). As with CASE13 in FIG. 14, CASE23 may correspond to the interval before the power-on operation is completed (e.g., from the time point t22 to the time point t23 in FIG. 18), and may correspond to the interval in which the PLP dump operation is completed and the first reset control signal DRST is activated (e.g., from the time point t27 to the time point t28 in FIG. 18). As with CASE14 in FIG. 14, CASE24 may correspond to the normal operation interval (e.g., from the time point t23 to the time point t25 in FIG. 18), and may correspond to the PLP dump interval (e.g., from the time point t26 to the time point t27 in FIG. 18).

Figure 20:
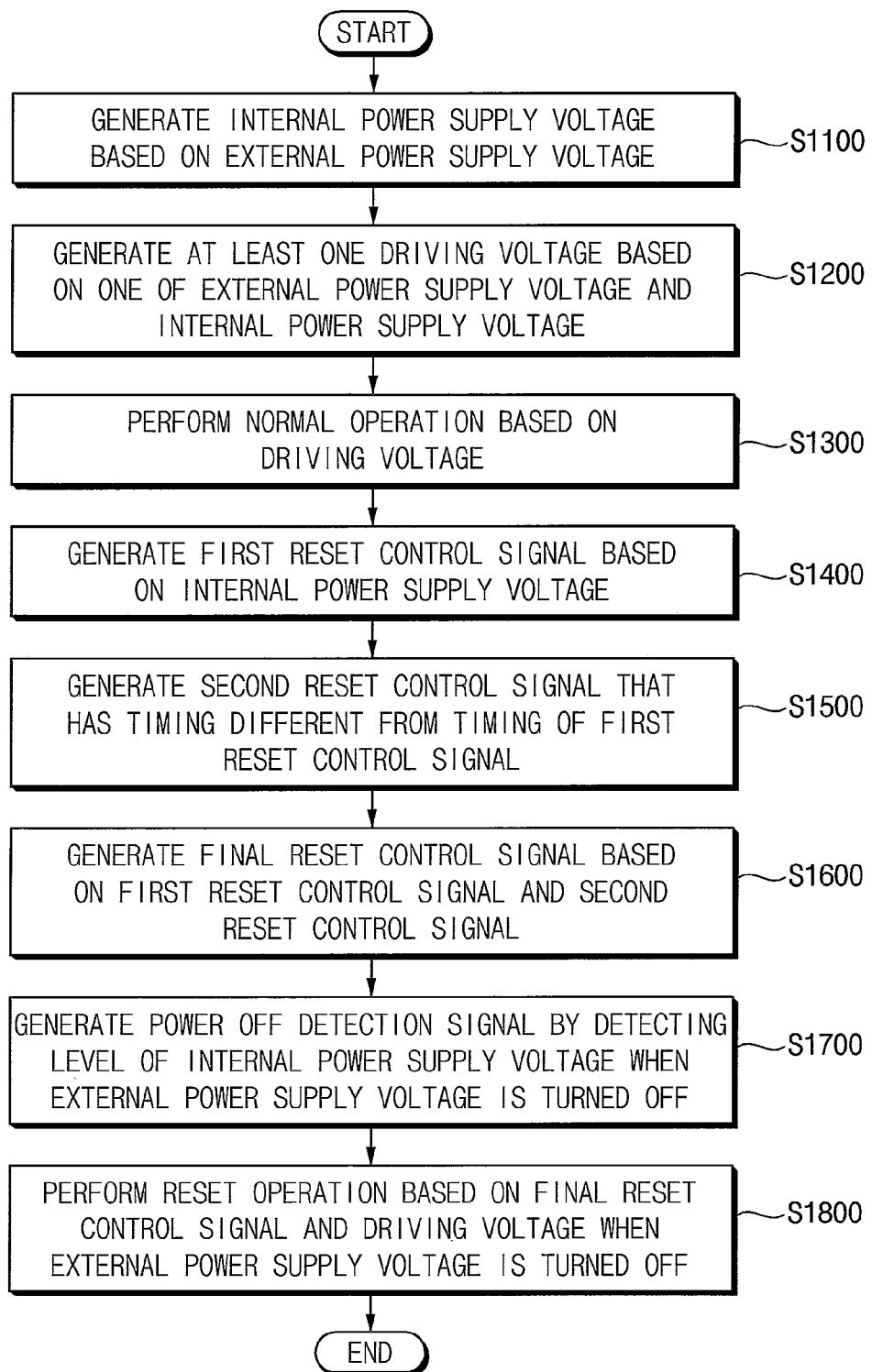
FIG. 20 is a flowchart illustrating a method of resetting a storage device according to example embodiments.

FIG. 20 is a flowchart illustrating a method of resetting a storage device according to example embodiments. The descriptions repeated with FIG. 1 will be omitted.

Referring to FIG. 20, in a method of resetting a storage device according to example embodiments, an internal power supply voltage having a level lower than or equal to a level of an external power supply voltage is generated based on the external power supply voltage (step S1100). Step S1100 may be the same as step S100 in FIG. 1.

At least one driving voltage is generated based on one of the external power supply voltage and the internal power supply voltage (step S1200). A normal operation is performed based on the driving voltage (step S1300). Steps S1200 and S1300 may be performed by a power management integrated circuit and a storage controller, respectively.

A first reset control signal is generated by detecting the level of the internal power supply voltage such that the first reset control signal is activated when the level of the internal power supply voltage is higher than a reference level (step S1400). A second reset control signal that is activated or deactivated with a timing different from that of the first reset control signal is generated (step S1500). A final reset control signal that is activated when at least one of the first reset control signal and the second reset control signal is activated is generated based on the first reset control signal and the second reset control signal (step S1600). Steps S1400, S1500 and S1600 may be the same as steps S200, S300 and S400 in FIG. 1, respectively.

A power off detection signal is generated by detecting the level of the internal power supply voltage when the external power supply voltage is turned off (step S1700). The power off detection signal represents that the external power supply voltage is turned off. Step S1700 may be performed by the power-loss protection integrated circuit.

When the external power supply voltage is turned off, a reset operation is performed based on the final reset control signal that is activated and the driving voltage that is generated based on the internal power supply voltage VINT (step S1800). Step S1800 may be the same as step S500 in FIG. 1.

As described above, the second reset control signal may be an off ready signal that is provided from the storage controller or a signal that is generated based on the power off detection signal. In some example embodiments, the second reset control signal may be provided from the reset signal generator. The final reset control signal may maintain the activation level for a predetermined time even after the external power supply voltage is turned off, and the reset operation may be performed based on the final reset control signal having (e.g., maintaining) the activation level and the driving voltage generated based on the internal power supply voltage.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 21:
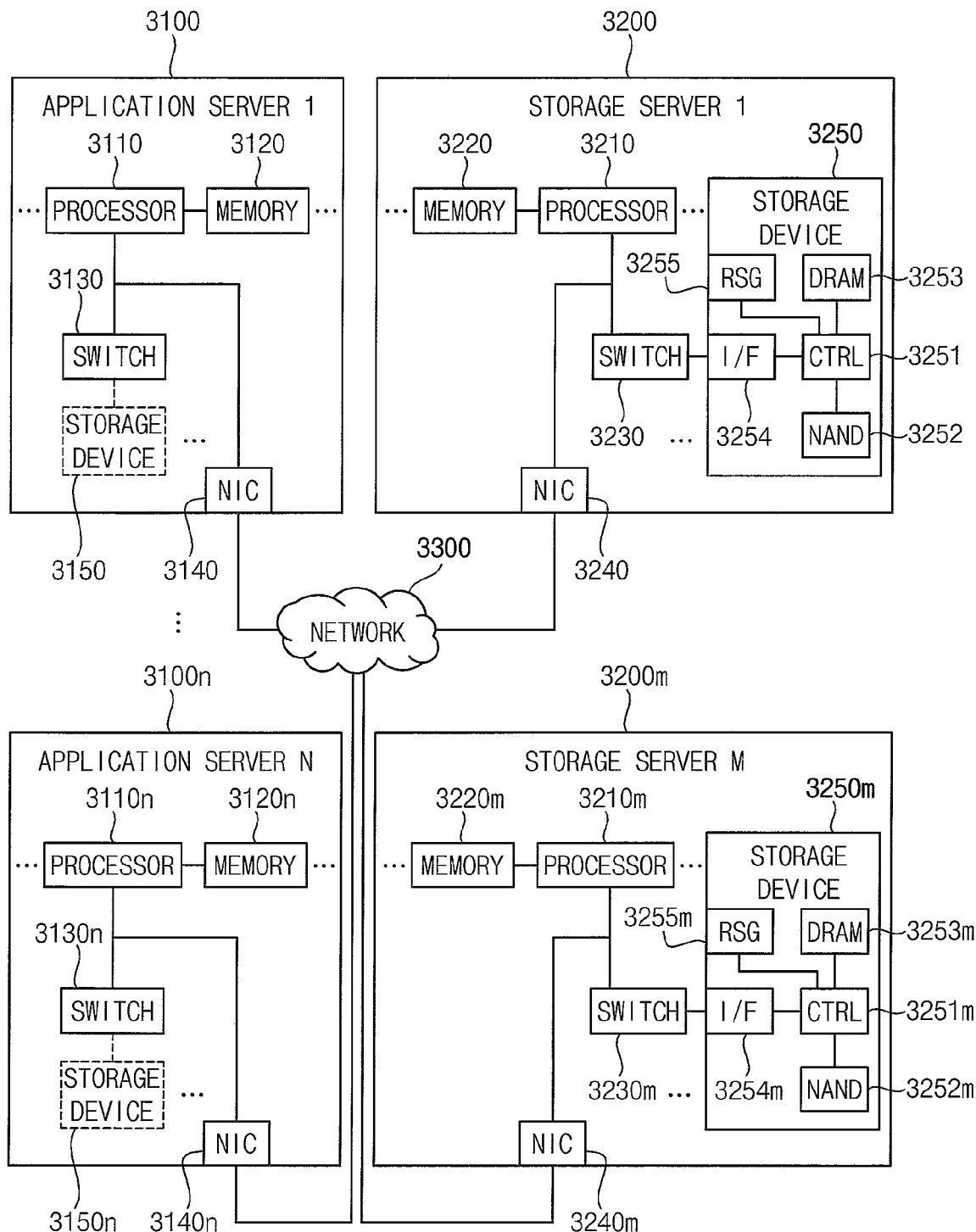
FIG. 21 is a block diagram illustrating a data center including a storage system according to example embodiments.

FIG. 21 is a block diagram illustrating a data center including a storage system according to example embodiments.

Referring to FIG. 21, a data center 3000 may be a facility that collects various types of data and provides various services, and may be referred to as a data storage center. The data center 3000 may be a system for operating search engines and databases, and may be a computing system used by companies such as banks or government agencies. The data center 3000 may include application servers 3100 to 3100n and storage servers 3200 to 3200m. The number of the application servers 3100 to 3100n and the number of the storage servers 3200 to 3200m may be variously selected according to example embodiments, and the number of the application servers 3100 to 3100n and the number of the storage servers 3200 to 3200m may be different from each other.

The application server 3100 may include at least one processor 3110 and at least one memory 3120, and the storage server 3200 may include at least one processor 3210 and at least one memory 3220. An operation of the storage server 3200 will be described as an example. The processor 3210 may control overall operations of the storage server 3200, and may access the memory 3220 to execute instructions and/or data loaded in the memory 3220. The memory 3220 may include at least one of a double data rate (DDR) synchronous dynamic random access memory (SDRAM), a high bandwidth memory (HBM), a hybrid memory cube (HMC), a dual in-line memory module (DIMM), an Optane DIMM, a nonvolatile DIMM (NVDIMM), etc. The number of the processors 3210 and the number of the memories 3220 included in the storage server 3200 may be variously selected according to example embodiments. In some example embodiments, the processor 3210 and the memory 3220 may provide a processor-memory pair. In some example embodiments, the number of the processors 3210 and the number of the memories 3220 may be different from each other. The processor 3210 may include a single core processor or a multiple core processor. The above description of the storage server 3200 may be similarly applied to the application server 3100. The application server 3100 may include at least one storage device 3150, and the storage server 3200 may include at least one storage device 3250. In some example embodiments, the application server 3100 may not include the storage device 3150. The number of the storage devices 3250 included in the storage server 3200 may be variously selected according to example embodiments.

The application servers 3100 to 3100n and the storage servers 3200 to 3200m may communicate with each other through a network 3300. The network 3300 may be implemented using a fiber channel (FC) or an Ethernet. The FC may be a medium used for a relatively high speed data transmission, and an optical switch that provides high performance and/or high availability may be used. The storage servers 3200 to 3200m may be provided as file storages, block storages or object storages according to an access scheme of the network 3300.

In some example embodiments, the network 3300 may be a storage-only network or a network dedicated to a storage such as a storage area network (SAN). For example, the SAN may be an FC-SAN that uses an FC network and is implemented according to an FC protocol (FCP). For another example, the SAN may be an IP-SAN that uses a transmission control protocol/internet protocol (TCP/IP) network and is implemented according to an iSCSI (a SCSI over TCP/IP or an Internet SCSI) protocol. In other example embodiments, the network 3300 may be a general or normal network such as the TCP/IP network. For example, the network 3300 may be implemented according to at least one of protocols such as an FC over Ethernet (FCoE), a network attached storage (NAS), a nonvolatile memory express (NVMe) over Fabrics (NVMe-oF), etc.

Hereinafter, example embodiments will be described based on the application server 3100 and the storage server 3200. The description of the application server 3100 may be applied to the other application server 3100n, and the description of the storage server 3200 may be applied to the other storage server 3200m.

The application server 3100 may store data requested to be stored by a user or a client into one of the storage servers 3200 to 3200m through the network 3300. In addition, the application server 3100 may obtain data requested to be read by the user or the client from one of the storage servers 3200 to 3200m through the network 3300. For example, the application server 3100 may be implemented as a web server or a database management system (DBMS).

The application server 3100 may access a memory 3120n or a storage device 3150n included in the other application server 3100n through the network 3300, and/or may access the memories 3220 to 3220m or the storage devices 3250 to 3250m included in the storage servers 3200 to 3200m through the network 3300. Thus, the application server 3100 may perform various operations on data stored in the application servers 3100 to 3100n and/or the storage servers 3200 to 3200m. For example, the application server 3100 may execute a command for moving or copying data between the application servers 3100 to 3100n and/or the storage servers 3200 to 3200m. The data may be transferred from the storage devices 3250 to 3250m of the storage servers 3200 to 3200m to the memories 3120 to 3120n of the application servers 3100 to 3100n directly or through the memories 3220 to 3220m of the storage servers 3200 to 3200m. For example, the data transferred through the network 3300 may be encrypted data for security or privacy.

In the storage server 3200, an interface 3254 may provide a physical connection between the processor 3210 and a controller 3251 and/or a physical connection between a network interface card (NIC) 3240 and the controller 3251. For example, the interface 3254 may be implemented based on a direct attached storage (DAS) scheme in which the storage device 3250 is directly connected with a dedicated cable. For example, the interface 3254 may be implemented based on at least one of various interface schemes such as an advanced technology attachment (ATA), a serial ATA (SATA) an external SATA (e-SATA), a small computer system interface (SCSI), a serial attached SCSI (SAS), a peripheral component interconnection (PCI), a PCI express (PCIe), an NVMe, an IEEE 1394, a universal serial bus (USB), a secure digital (SD) card interface, a multi-media card (MMC) interface, an embedded MMC (eMMC) interface, a universal flash storage (UFS) interface, an embedded UFS (eUFS) interface, a compact flash (CF) card interface, etc.

The storage server 3200 may further include a switch 3230 and the NIC 3240. The switch 3230 may selectively connect the processor 3210 with the storage device 3250 or may selectively connect the NIC 3240 with the storage device 3250 under a control of the processor 3210. Similarly, the application server 3100 may further include a switch 3130 and an NIC 3140.

In some example embodiments, the NIC 3240 may include a network interface card, a network adapter, or the like. The NIC 3240 may be connected to the network 3300 through a wired interface, a wireless interface, a Bluetooth interface, an optical interface, or the like. The NIC 3240 may further include an internal memory, a digital signal processor (DSP), a host bus interface, or the like, and may be connected to the processor 3210 and/or the switch 3230 through the host bus interface. The host bus interface may be implemented as one of the above-described examples of the interface 3254. In some example embodiments, the NIC 3240 may be integrated with at least one of the processor 3210, the switch 3230 and the storage device 3250.

In the storage servers 3200 to 3200m and/or the application servers 3100 to 3100n, the processor may transmit a command to the storage devices 3150 to 3150n and 3250 to 3250m or the memories 3120 to 3120n and 3220 to 3220m to program or read data. For example, the data may be error-corrected data by an error correction code (ECC) engine. For example, the data may be processed by a data bus inversion (DBI) or a data masking (DM), and may include a cyclic redundancy code (CRC) information. For example, the data may be encrypted data for security or privacy.

The storage devices 3150 to 3150m and 3250 to 3250m may transmit a control signal and command/address signals to NAND flash memory devices 3252 to 3252m in response to a read command received from the processor. When data is read from the NAND flash memory devices 3252 to 3252m, a read enable (RE) signal may be input as a data output control signal and may serve to output data to a DQ bus. A data strobe signal (DQS) may be generated using the RE signal. The command and address signals may be latched in a page buffer based on a rising edge or a falling edge of a write enable (WE) signal.

The controller 3251 may control overall operations of the storage device 3250. In some example embodiments, the controller 3251 may include a static random access memory (SRAM). The controller 3251 may write data into the NAND flash memory device 3252 in response to a write command, or may read data from the NAND flash memory device 3252 in response to a read command. For example, the write command and/or the read command may be provided from the processor 3210 in the storage server 3200, the processor 3210m in the other storage server 3200m, or the processors 3110 to 3110n in the application servers 3100 to 3100n. A DRAM 3253 may temporarily store (e.g., may buffer) data to be written to the NAND flash memory device 3252 or data read from the NAND flash memory device 3252. Further, the DRAM 3253 may store meta data. The meta data may be data generated by the controller 3251 to manage user data or the NAND flash memory device 3252. The storage device 3250 may include a reset signal generator (RSG) 3255 and may be implemented to prevent the abnormal reset off and to improve reliability.

The storage devices 3150 to 3150m and 3250 to 3250m may be implemented based on the storage device and the method according to example embodiments described with reference to FIGS. 1 through 20.

The inventive concept may be applied to various devices and systems that include the storage devices and the storage systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of resetting a storage device, the method comprising:
   receiving an external power supply voltage at the storage device;
   generating an internal power supply voltage based on the external power supply voltage;
   generating a first reset control signal that is activated when a level of the internal power supply voltage is higher than a reference level or deactivated when the level of the internal power supply voltage is lower than or equal to the reference level;
   generating a second reset control signal that is activated after a power-on of the storage device is completed or deactivated after a predetermined delay time from when the external power supply voltage is turned off;
   generating a final reset control signal based on the first reset control signal and the second reset control signal, wherein the final reset control signal is activated when at least one of the first and second reset control signals is activated; and
   after the external power supply voltage is turned off, performing a reset operation of the storage device when the final reset control signal is activated.

2. The method of claim 1, wherein generating the final reset control signal includes:
   generating the final reset control signal such that the final reset control signal is deactivated when the first and second reset control signals are deactivated,
   wherein the performing of the reset operation is completed when the final reset control signal is deactivated.

3. The method of claim 1, wherein the performing of the reset operation includes performing a dump operation such that the storage device stores data stored in a buffer memory included in the storage device into a nonvolatile memory included in the storage device during the dump operation.

4. The method of claim 3, wherein the second reset control signal is an off ready signal that is provided from a storage controller included in the storage device.

5. The method of claim 4, wherein generating the second reset control signal includes:
generating the off ready signal such that the off ready signal is deactivated after the dump operation is completed; and
using the off ready signal as the second reset control signal.

6. The method of claim 1, wherein the second reset control signal is generated based on a power off detection signal that is provided from a power-loss protection integrated circuit (PLP IC) included in the storage device.

7. The method of claim 6, wherein the generating of the second reset control signal includes:
generating the power off detection signal such that the power off detection signal is activated when the level of the internal power supply voltage is higher than a first level higher than the reference level and deactivated when the level of the internal power supply voltage is lower than or equal to a second level lower than the first level and higher than the reference level; and
generating the second reset control signal such that the second reset control signal is deactivated by delaying the power off detection signal that is deactivated.

8. The method of claim 7, wherein:
the internal power supply voltage has a third level that is equal to a level of the external power supply voltage before the external power supply voltage is turned off, and
the internal power supply voltage has the first level that is lower than the third level after the external power supply voltage is turned off.

9. The method of claim 1, wherein the performing of the reset operation includes providing the final reset control signal to a storage controller included in the storage device, and
wherein the performing of the reset operation is maintained before the level of the internal power supply voltage becomes lower than the reference level.

10. A storage device comprising:
a power-loss protection integrated circuit (PLP IC) configured to generate an internal power supply voltage based on an external power supply voltage;
a reset detector configured to generate a first reset control signal that is activated or deactivated based on a level of the internal power supply voltage;
a reset controller configured to generate a final reset control signal based on the first reset control signal and a second reset control signal that is activated or deactivated with a timing different from that of the first reset control signal, the final reset control signal being activated or deactivated with a timing different from those of the first reset control signal and the second reset control signal; and
a storage controller configured to control an operation of the storage device, and to perform a reset operation based on the final reset control signal when the external power supply voltage is turned off.

11. The storage device of claim 10, wherein the reset controller includes:

an OR gate configured to generate the final reset control signal by performing an OR operation on the first reset control signal and the second reset control signal.

12. The storage device of claim 10, wherein the storage controller is configured to further perform a dump operation such that the storage controller stores data stored in a buffer memory included in the storage device into a nonvolatile memory included in the storage device during the dump operation.

13. The storage device of claim 10, wherein:
the power-loss protection integrated circuit is configured to further generate a power off detection signal based on the level of the internal power supply voltage, and
the storage device further includes a delay unit configured to generate the second reset control signal by delaying the power off detection signal.

14. The storage device of claim 13, wherein the delay unit includes:
an edge delay circuit configured to generate the second reset control signal by delaying a falling edge of the power off detection signal.

15. The storage device of claim 10, wherein the reset detector includes a voltage level detector configured to:
detect the level of the internal power supply voltage,
generate the first reset control signal such that the first reset control signal is activated when the level of the internal power supply voltage is higher than a reference level, and
generate the first reset control signal such that the first reset control signal is deactivated when the level of the internal power supply voltage is lower than or equal to the reference level.

16. The storage device of claim 10, further comprising:
a power management integrated circuit (PMIC) configured to generate a driving voltage supplied to the storage controller based on one of the external power supply voltage and the internal power supply voltage.

17. The storage device of claim 16, wherein:
the power management integrated circuit is configured to generate the driving voltage based on the external power supply voltage before the external power supply voltage is turned off, and to generate the driving voltage based on the internal power supply voltage after the external power supply voltage is turned off, and
the storage controller is configured to perform the reset operation based on the driving voltage.

18. The storage device of claim 10, further comprising:
a plurality of nonvolatile memories configured to store a plurality of data; and
a buffer memory configured to temporarily store the plurality of data to be stored or stored in the plurality of nonvolatile memories, and
wherein, when the reset operation is performed, the plurality of data stored in the buffer memory are stored into the plurality of nonvolatile memories.

19. A method of resetting a storage device, the method comprising:
generating an internal power supply voltage based on an external power supply voltage, the internal power supply voltage having a level lower than or equal to a level of the external power supply voltage;
generating a driving voltage based on one of the external power supply voltage and the internal power supply voltage;
generating a first reset control signal by detecting the level of the internal power supply voltage such that the first reset control signal is activated when the level of the internal power supply voltage is higher than a reference level and deactivated when the level of the internal power supply voltage is lower than or equal to the reference level;

generating a second reset control signal that is activated when a power-on or a booting operation of the storage device being completed or deactivated after a predetermined delay time from when the external power supply voltage is turned off;

generating a final reset control signal based on the first reset control signal and the second reset control signal, the final reset control signal that is activated when at least one of the first reset control signal and the second reset control signal is activated and deactivated when the first and second reset control signals are deactivated;

generating a power off detection signal by detecting the level of the internal power supply voltage when the external power supply voltage is turned on or turned off; and when the external power supply voltage is turned off, performing a reset operation based on the final reset control signal and the driving voltage, wherein the second reset control signal is a signal that is generated based on an off ready signal provided from a storage controller included in a storage device or based on the power off detection signal, wherein the final reset control signal maintains an activation level for a predetermined time after the external power supply voltage is turned off, and wherein the reset operation is performed based on the final reset control signal having the activation level and the driving voltage generated based on the internal power supply voltage.

* * * * *